(12) United States Patent
Abe et al.

(10) Patent No.: US 9,153,680 B2
(45) Date of Patent: Oct. 6, 2015

(54) STIMULATED PHONON EMISSION DEVICE AND OSCILLATOR, FREQUENCY FILTER, COOLING DEVICE, LIGHT-RECEIVING DEVICE, AND LIGHT-EMITTING DEVICE COMPRISING THE STIMULATED PHONON EMISSION DEVICE

(71) Applicant: KABUSHIKI KAISHA TOSHIBA, Minto-ku (JP)

(72) Inventors: Kazuhide Abe, Kanagawa (JP); Kazuhiko Itaya, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 115 days.

(21) Appl. No.: 13/965,654

(22) Filed: Aug. 13, 2013

(65) Prior Publication Data

US 2014/0054652 A1    Feb. 27, 2014

(30) Foreign Application Priority Data

Aug. 24, 2012    (JP) .................................. 2012-185733

(51) Int. Cl.

| | |
|---|---|
| H01L 29/84 | (2006.01) |
| H01L 29/772 | (2006.01) |
| H01L 31/00 | (2006.01) |
| H01S 4/00 | (2006.01) |

(52) U.S. Cl.
CPC .............. *H01L 29/772* (2013.01); *H01L 31/00* (2013.01); *H01S 4/00* (2013.01)

(58) Field of Classification Search
CPC .......... H01L 29/722; H01L 31/00; H01S 4/00
USPC ......................................... 257/254, 288, 344
See application file for complete search history.

(56) References Cited

U.S. PATENT DOCUMENTS

| | | | |
|---|---|---|---|
| 5,356,821 A | 10/1994 | Naruse et al. | |
| 5,917,195 A | 6/1999 | Brown | |

(Continued)

FOREIGN PATENT DOCUMENTS

| | | |
|---|---|---|
| JP | 6-69434 A | 3/1994 |
| JP | 11-500580 | 1/1999 |
| JP | 2007-214278 A | 8/2007 |
| JP | 4945650 | 3/2012 |

OTHER PUBLICATIONS

U.S. Appl. No. 13/685,859, filed Nov. 27, 2012, Kazuhide Abe, et al.

(Continued)

*Primary Examiner* — Long K Tran
(74) *Attorney, Agent, or Firm* — Oblon, McClelland, Maier & Neustadt, L.L.P.

(57) ABSTRACT

A stimulated phonon emission device of an embodiment is provided with a first electroconductive type of semiconductor substrate of an indirect transition type semiconductor crystal, a second electroconductive type of well region provided in the semiconductor substrate, an element isolation region deeper than the well region, an element region surrounded by the element isolation region, and a field-effect transistor having a plurality of gate electrodes which are formed in the well region in the element region, are parallel to each other, and are arranged at a constant pitch and first electroconductive type of source region and drain region provided in the element regions on the both sides of the gate electrode.

16 Claims, 28 Drawing Sheets

(56) References Cited

U.S. PATENT DOCUMENTS

| | | |
|---|---|---|
| 8,039,873 B2 | 10/2011 | Abe et al. |
| 2007/0128815 A1* | 6/2007 | Iino et al. .................. 438/297 |
| 2007/0181966 A1 | 8/2007 | Watatani et al. |
| 2011/0220974 A1* | 9/2011 | Abe et al. .................. 257/288 |
| 2012/0241877 A1 | 9/2012 | Abe et al. |
| 2012/0299097 A1* | 11/2012 | Bulucea .................. 257/344 |

OTHER PUBLICATIONS

S. Sinha, et al., "Non-Equilibrium Phonon Distributions in Sub-100 nm Silicon Transistors", Journal of Heat Transfer, Transactions of the ASME, vol. 128, Jul. 2006, pp. 638-647.

Office Action issued on Sep. 16, 2014 in the corresponding Japanese Patent Application No. 2012-185733 (with English Translation).

* cited by examiner $n_{q1} \gg n_{q2} = n_{q3} = n_{q4} = n_{q5} = n_{q6}$

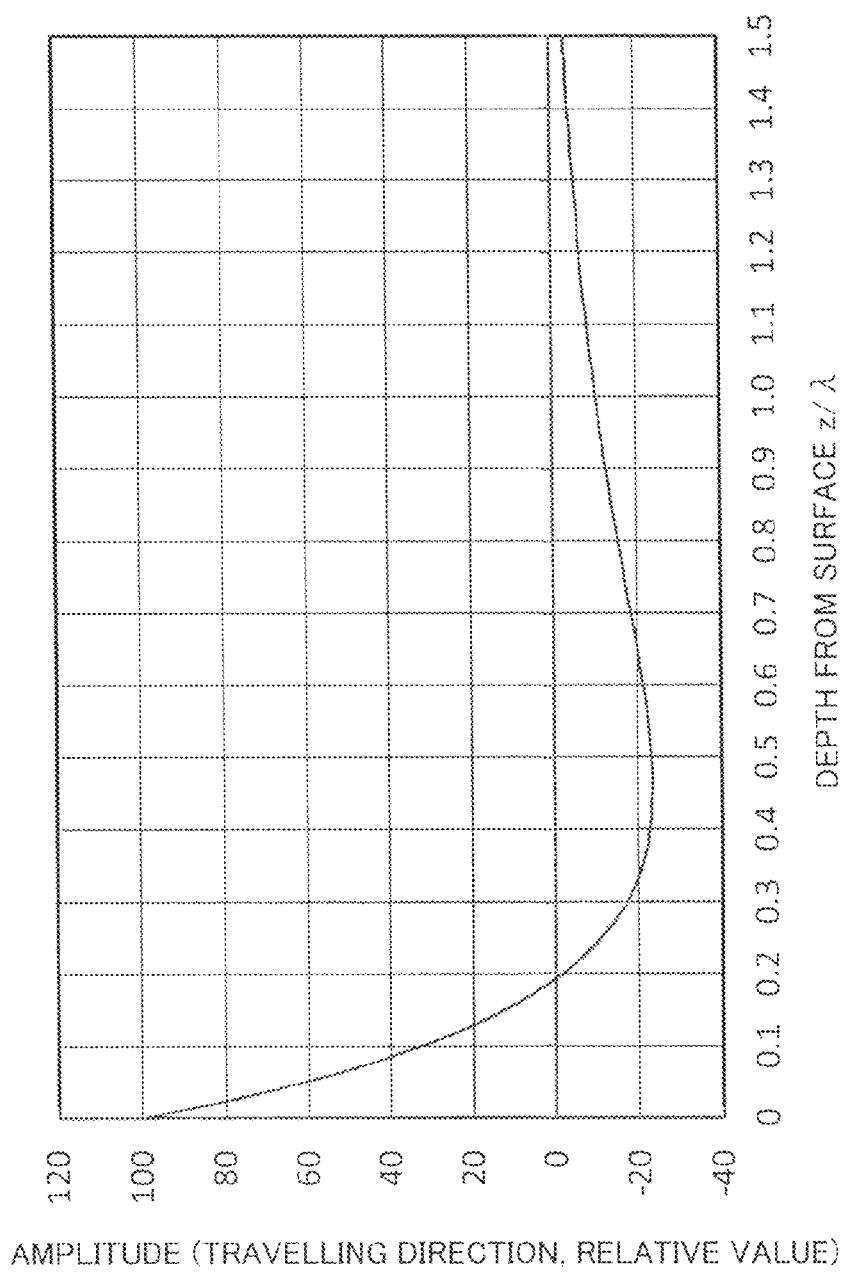

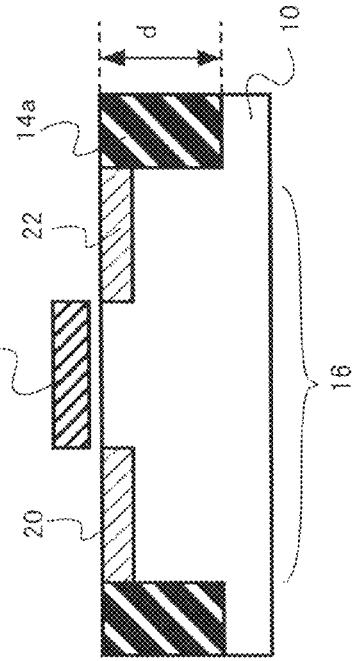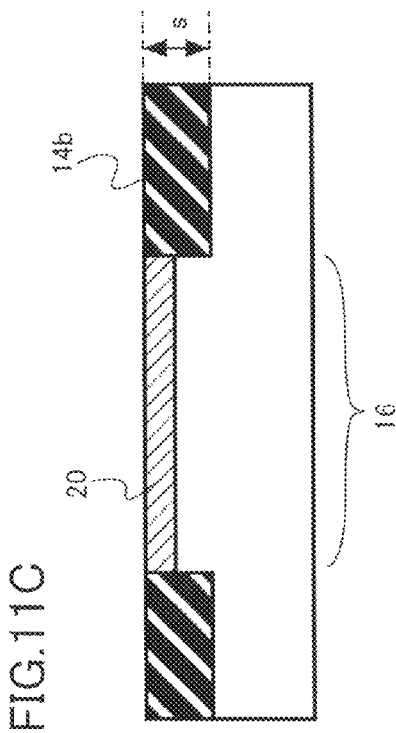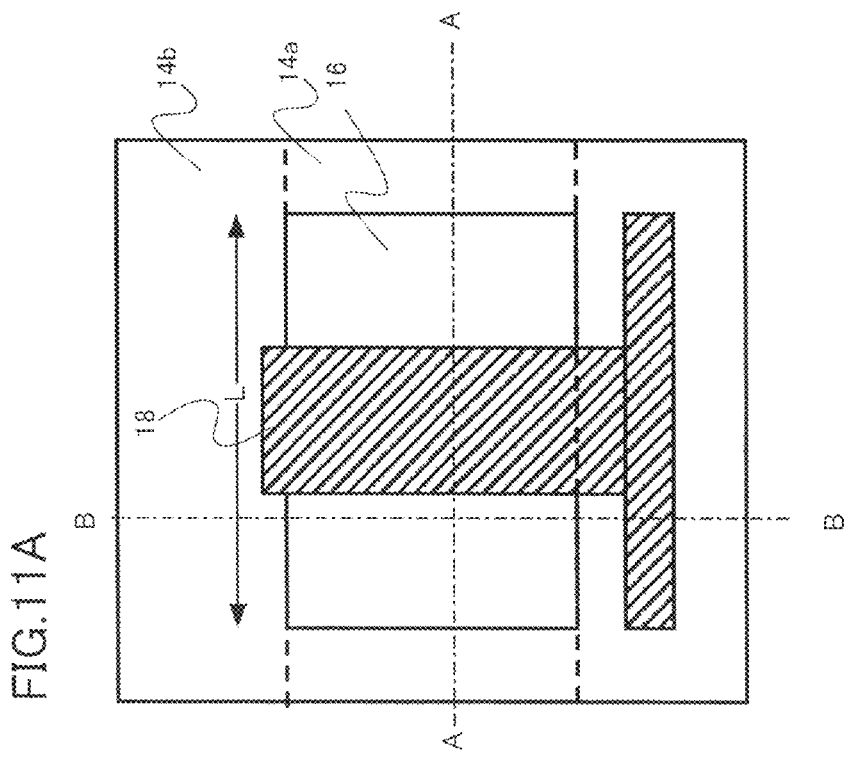

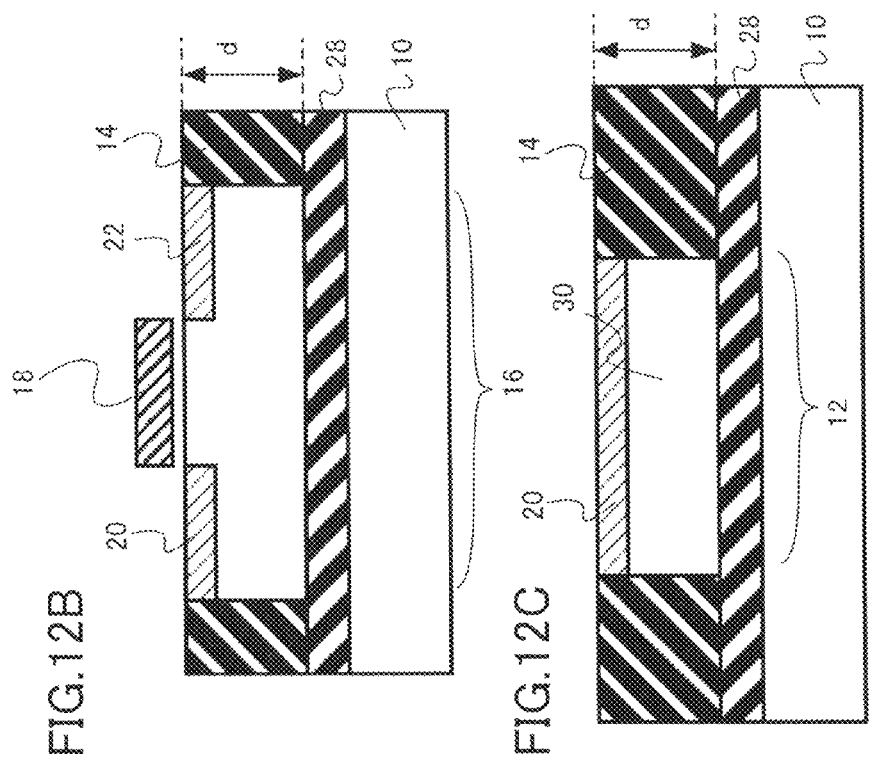
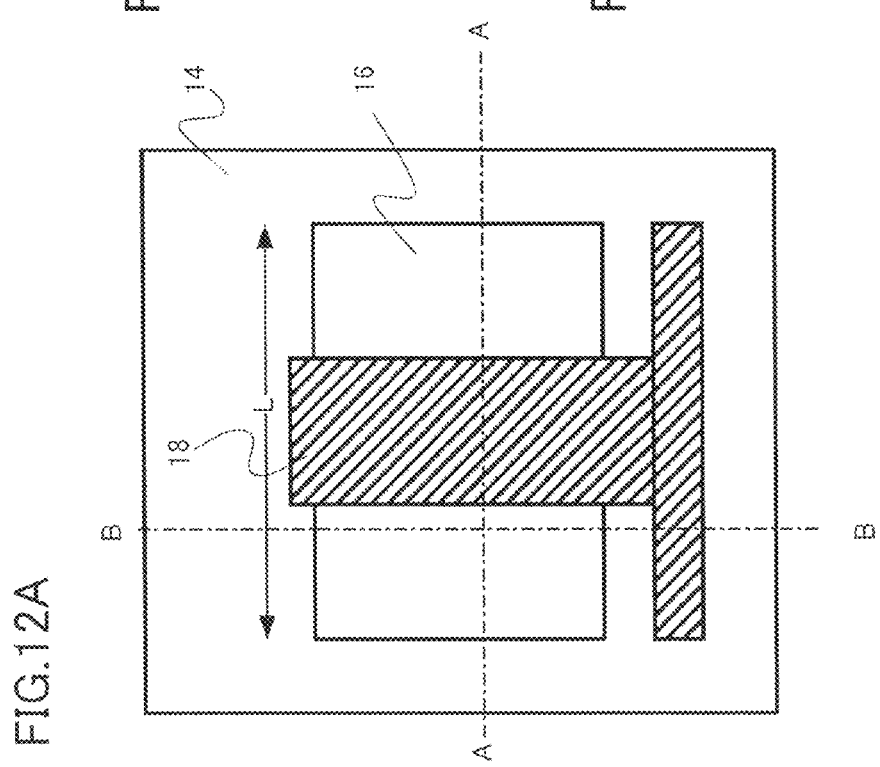

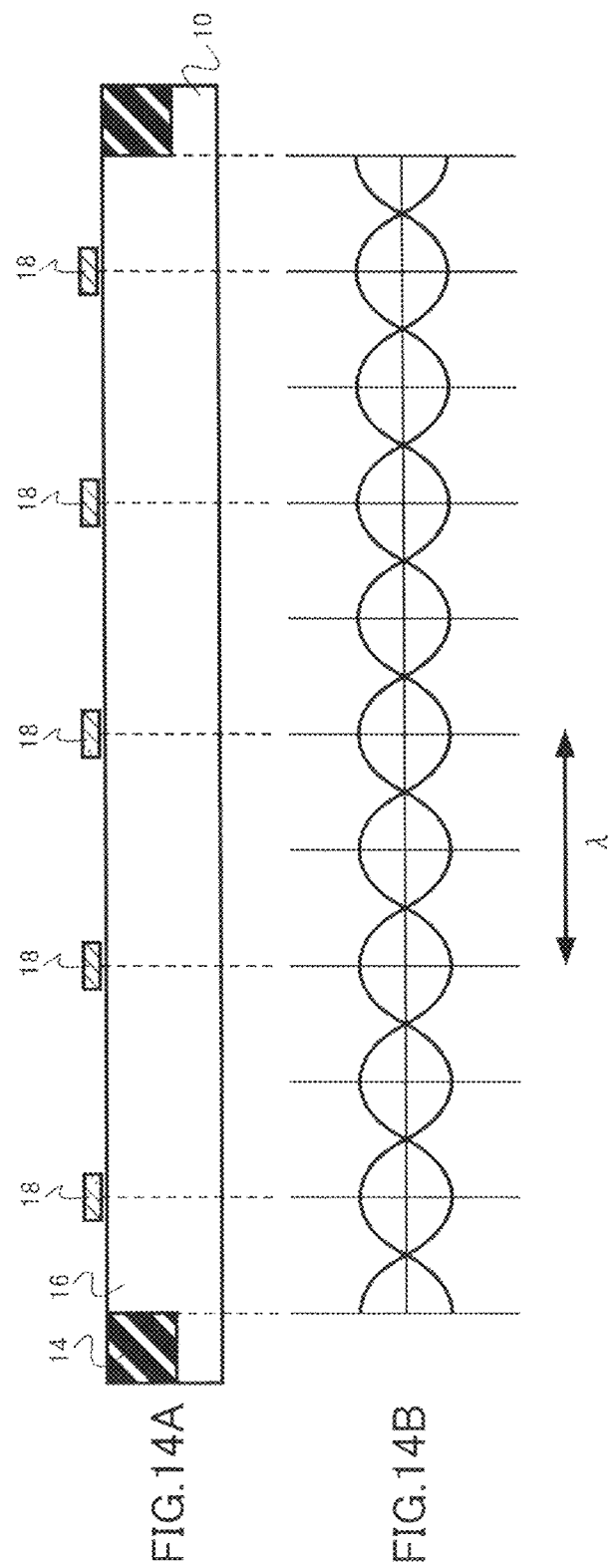

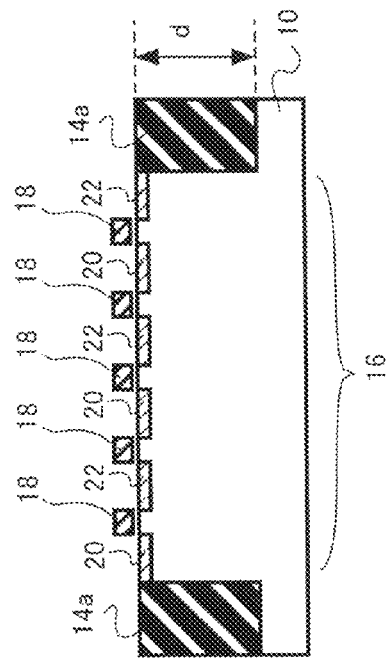
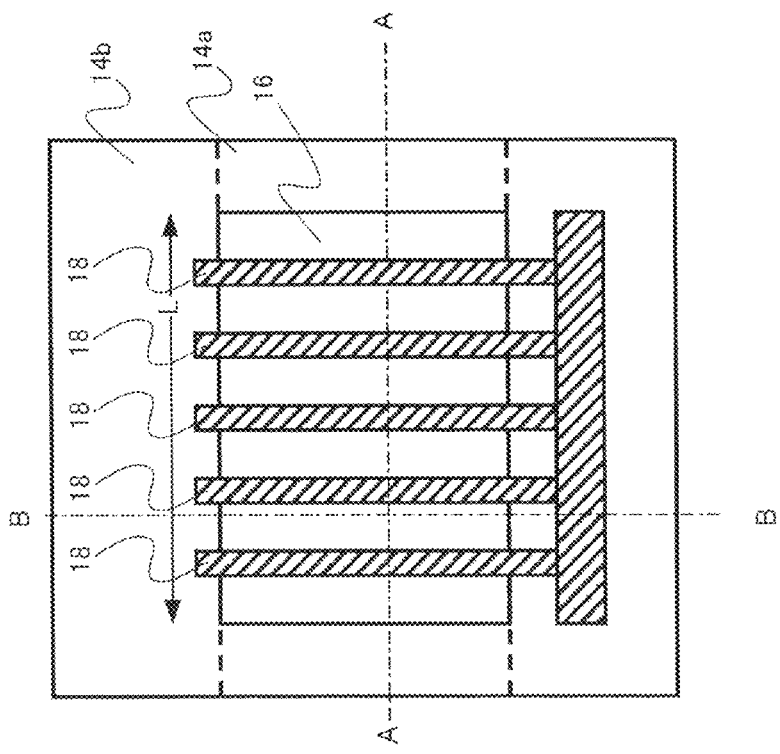
FIG.17A
FIG.17B
FIG.17C

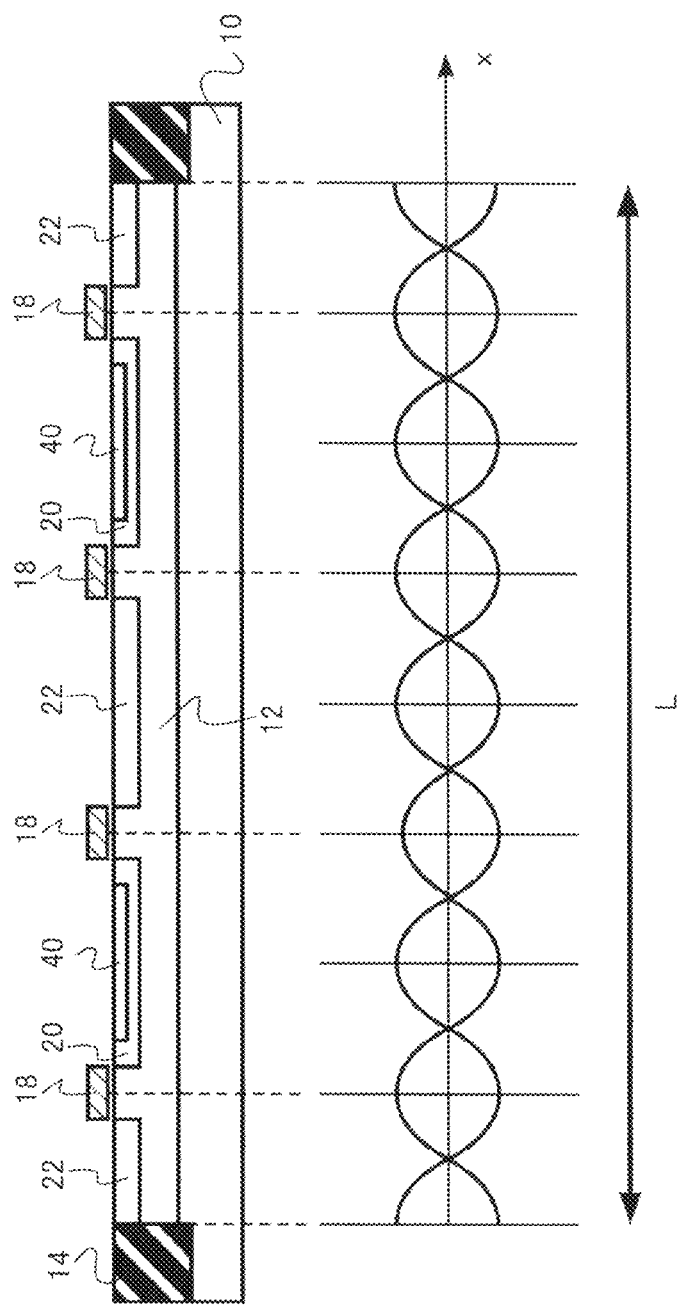

US 9,153,680 B2

STIMULATED PHONON EMISSION DEVICE AND OSCILLATOR, FREQUENCY FILTER, COOLING DEVICE, LIGHT-RECEIVING DEVICE, AND LIGHT-EMITTING DEVICE COMPRISING THE STIMULATED PHONON EMISSION DEVICE

CROSS-REFERENCE TO RELATED APPLICATION

This application is based upon and claims the benefit of priority from Japanese Patent Application No. 2012-185733, filed on Aug. 24, 2012, the entire contents of which are incorporated herein by reference.

FIELD

Embodiments described herein relate generally to a stimulated phonon emission device and an oscillator, a frequency filter, a cooling device, a light-receiving device, and a light-emitting device provided with the stimulated phonon emission device.

BACKGROUND

A quantized lattice vibration in a crystal is called a phonon, and various physical phenomena generated in a crystal, including specific heat, can be correctly described by introducing the idea of the phonon. Although the phonon can be understood as a form of thermal vibration energy of a crystal lattice, an elastic wave (acoustical wave) propagating in a crystal is also another form of the phonon with an extremely low vibration frequency.

Conventionally, piezoelectric resonators such as a quartz oscillator and a surface acoustic wave device are widely used as electric parts using an acoustical wave in a crystal. However, integration of those piezoelectric resonators with other semiconductor electron circuitry has been difficult.

Meanwhile, there has been known a method of realizing the phonon oscillator, using an interaction between electrons and the phonons inside a semiconductor crystal. However, in the conventional method, it is difficult to realize such a phonon oscillator with the use of an integrated circuit process.

BRIEF DESCRIPTION OF THE DRAWINGS

FIG. 9 is a view showing a depth dependency of an amplitude of an acoustical wave;

FIGS. 11A to 11C are views schematically showing a configuration of a stimulated phonon emission device of the second embodiment;

FIGS. 12A to 12C are equivalent circuit schematics of a stimulated phonon emission device of the third embodiment;

FIGS. 14A and 14B are explanatory views of an acoustic standing wave excited by the stimulated phonon emission device of the fourth embodiment;

FIGS. 17A to 17C are views schematically showing a configuration of a stimulated phonon emission device of the fifth embodiment;

FIGS. 29A and 29B are cross-sectional views of a relevant portion of a light-emitting device of the eleventh embodiment.

DETAILED DESCRIPTION

The inventors have found that a stimulated phonon emission device which generates a coherent phonon with a predetermined frequency can be realized using a field-effect transistor formed by a semiconductor process. This technology has been made based on the above finding.

Hereinafter, embodiments of this technology will be described with reference to the drawings.

In this specification, "terminals" such as a gate terminal of a gate electrode are not necessarily structures physically independently distinguished from an electrode, an impurity diffusion region, a contact region, and a wiring region. For example, in the gate terminal, any form may be applied as long as it is a structure applying a potential to the gate electrode.

First Embodiment

A stimulated phonon emission device is provided with a first electroconductive type of semiconductor substrate of an indirect transition type semiconductor crystal, a second electroconductive type of well region formed in the semiconductor substrate, an element isolation region deeper than the well region, an element region surrounded by the element isolation region, a single gate electrode formed in the well region in the element region, and a field-effect transistor having the first electroconductive type of source region and drain region formed in the element regions on the both sides of the gate electrode.

In the present embodiments, according to the above constitution, a high efficiency stimulated phonon emission device easily integrated with other electron circuitry can be realized with a simple structure, using a typical semiconductor process.

Figure 1B:
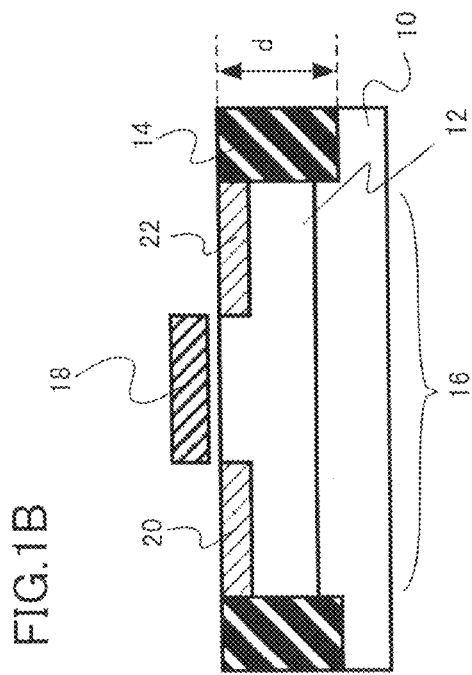
FIGS. 1A and 1B are views schematically showing a configuration of a stimulated phonon emission device of the first embodiment.
Figure 1A:
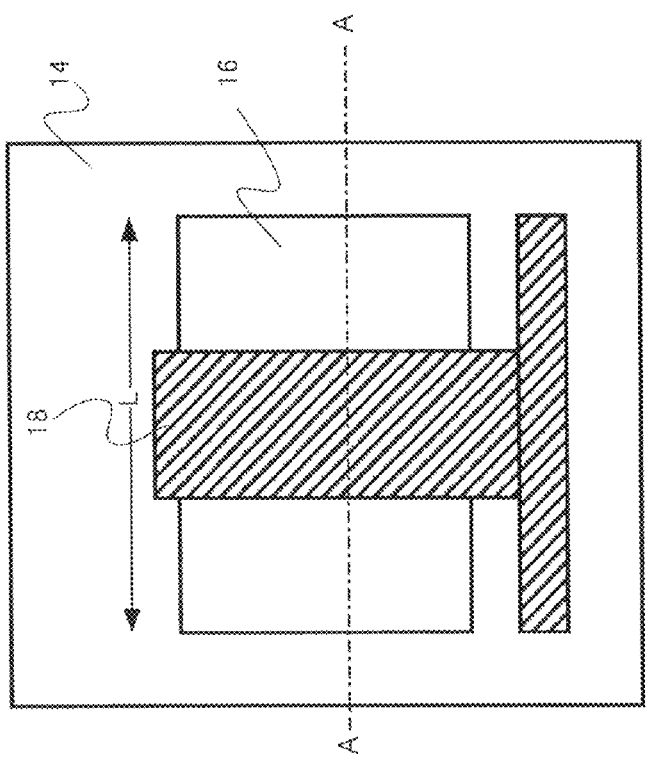

FIGS. 1A and 1B are views schematically showing a configuration of a stimulated phonon emission device of the present embodiment. FIG. 1A is a plan view of the stimulated phonon emission device, and FIG. 1B is a cross-sectional view along a line A-A of FIG. 1A.

As shown in FIG. 1, the stimulated phonon emission device is provided with the first electroconductive type of semiconductor substrate 10 of an indirect transition type semiconductor crystal. For example, the semiconductor substrate 10 is made of n-type silicon. As the semiconductor substrate 10, other indirect transition type semiconductor crystals such as germanium may be applied. A semiconductor crystal having a different electroconductive type from that of the semiconductor substrate 10 may be provided in a lower portion of the semiconductor substrate 10. In this case, the semiconductor substrate 10 corresponds to an n-type deep well formed in p-type silicon.

A well region 12 which is of the second electroconductive type is provided in the semiconductor substrate 10. The well region 12 is of the p-type, for example.

The semiconductor substrate 10 further includes an element isolation region 14 whose depth d from an upper surface of the semiconductor substrate 10 is larger than the depth of the well region 12. The element isolation region 14 is embedded with an insulating film, for example, a silicon oxide film. The element isolation region 14 functions as an acoustic reflecting structure.

The semiconductor substrate 10 furthermore includes an element region 16 surrounded by the element isolation region 14. The well region 12 is provided in the element region 16.

A field-effect transistor is provided in the well region 12 in the element region 16. The field-effect transistor is provided with a single gate electrode 18 and n-type source region 20 and drain region 22 provided in the element regions 12 on the both sides of the gate electrode 18.

The gate electrode 18 is provided on the element region 12 through a gate insulating film (not shown).

The element region 16 has a rectangular shape having the length L in a gate length direction of the field-effect transistor. The element isolation region 14 preferably has an end substantially parallel to the gate electrode 18. Namely, it is preferable that a boundary between the element region 16 in the gate length direction of the gate electrode 18 and the element isolation region 14 is substantially parallel to the extending direction of the gate electrode. This is because a stable acoustic standing wave can be generated.

Figure 2:
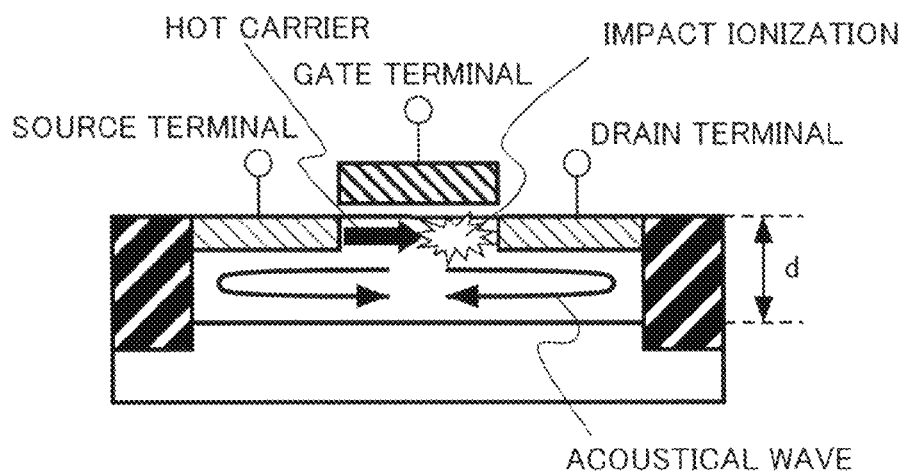
FIG. 2 is a view for explaining an operation of the stimulated phonon emission device of the first embodiment.

FIG. 2 is a view for explaining an operation of the stimulated phonon emission device of the present embodiment.

In this embodiment, for example, a bias voltage is applied under a suitable bias condition among the gate electrode 18, the drain region 22, and the source region 20 of the field-effect transistor, more specifically, a condition in which a portion of a channel in the field-effect transistor is pinched off, that is, a condition in which a drain current is saturated. More specifically, a gate terminal, a source terminal, and a drain terminal applying voltage respectively to the gate electrode 18, the drain region 22, and the source region 20 of the field-effect transistor are provided. When a threshold voltage of the field-effect transistor is Vth, a bias condition is applied so that a gate voltage Vgs applied between the source terminal and the gate terminal and a drain voltage Vds applied between the source terminal and the drain terminal satisfy a relation of Vth<Vgs<Vds+Vth.

Consequently, a carrier running in a channel is satisfactorily accelerated by a drain-to-source voltage, and high energy is applied to the carrier, whereby the carrier is in a so-called hot carrier state. A hot carrier collides with a crystal lattice with a certain rate (impact ionization rate) to cause impact ionization.

Although electrons and halls are newly generated by the impact ionization, an acoustical wave is generated simultaneously with the generation of the electrons and holes to be propagated in the gate length direction, for example, and, thus, to be reflected in the element isolation region 14 functioning as an acoustic reflecting structure. As a result, an acoustic standing wave is generated in the element region 12.

Figure 3A:
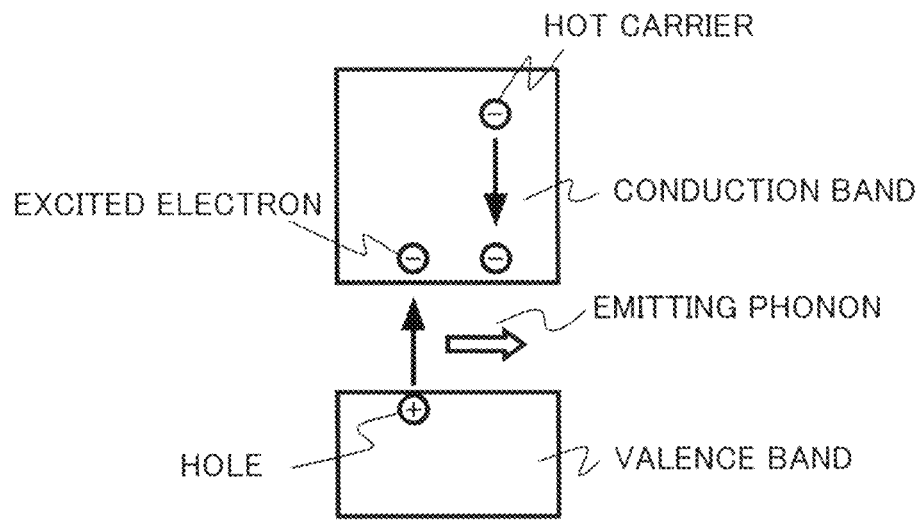
FIGS. 3A and 3B are views for explaining an operation of the stimulated phonon emission device of the first embodiment.
Figure 3B:
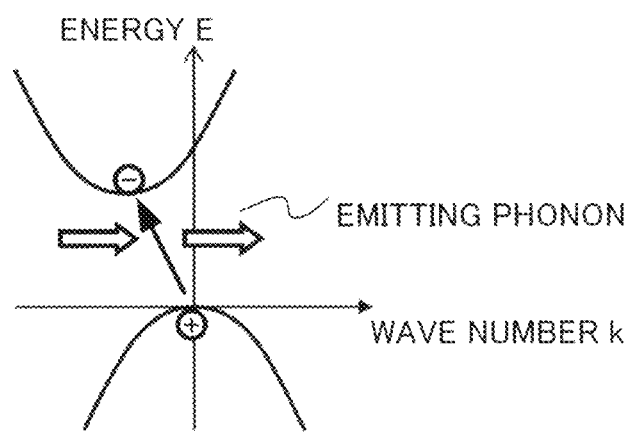

FIGS. 3A and 3B are views for explaining an operation of the stimulated phonon emission device of the present embodiment. FIGS. 3A and 3B are views schematically showing the principle of the impact ionization in an indirect transition type semiconductor. FIG. 3A is a band diagram illustrated without considering the wave number of electrons, and FIG. 3B is a view schematically showing a band diagram considering the wave number k of the electron in the horizontal axis. The vertical axes respectively represent an energy E of the electrons in a valence band and the energy E of the electrons in a conduction band.

As shown in FIG. 3A, when a hot carrier collides with the crystal lattice to cause the impact ionization, the energy of the hot carrier is partially lost, and an electron bound in an orbit of an atom is excited from the valance band to the conduction band. Consequently, an excited electron is created in the conduction band, and a hole is created in the valance band.

However, as shown in FIG. 3B, in an indirect transition semiconductor crystal typified by silicon, the wave number k of the electron is different between the electron having the highest energy in the valance band and the electron having the lowest energy in the conduction band. Such a change of the wave number (momentum) should be compensated by creation of a phonon.

The phonon is a kind of bosons and obeys Bose-Einstein statistics. As a boson, it is allowed that a plurality of particles exist in the same energy state. The increase and decrease of the number of phonon should obey rules for creation and annihilation of boson in quantum mechanics.

A quantum state with $n_q$ phonons in a specific energy is represented by $|n_q\rangle$. An operation being operated to the state $|n_q\rangle$ to increase the number of phonon by one is represented by $\hat{a}^*$.

The change of state induced by this generating operation is generally represented by the following formula (1):

$$\hat{a}^{*}|n_q\rangle = \sqrt{n_q+1}|n_q+1\rangle. \quad \text{[Formula (1)]}$$

The formula (1) shows that in the operation has an eigenvalue value of $$\sqrt{n_q+1}.$$

Since the probability is proportional to the square of the factor, the probability to occur this process should be $n_q+1$ times. The formula (1) further shows that even if no phonon exist, that is, even if $n_q=0$, this process may occur with a certain rate (spontaneous emission).

However, in a state in which a large number of the phonons exist, this process (stimulated emission of phonon) realizes a high probability in proportion to the number of the phonons, $n_q$. In FIG. 3B, for example, when the number of the incident phonons is $n_q$ and the number of emitted photons is $n_q+1$ by being increased by one, the probability of this process is $n_q+1$ times in comparison with the case of the spontaneous emission ($n_q=0$). Such a property regarding the creation and annihilation process of phonon is caused by being a boson, and a physical mechanism is the same as the creatioin and annihilation process of photon. Namely, the mechanism shown in FIG. 3B is the same as optical laser oscillation.

Figure 4A:
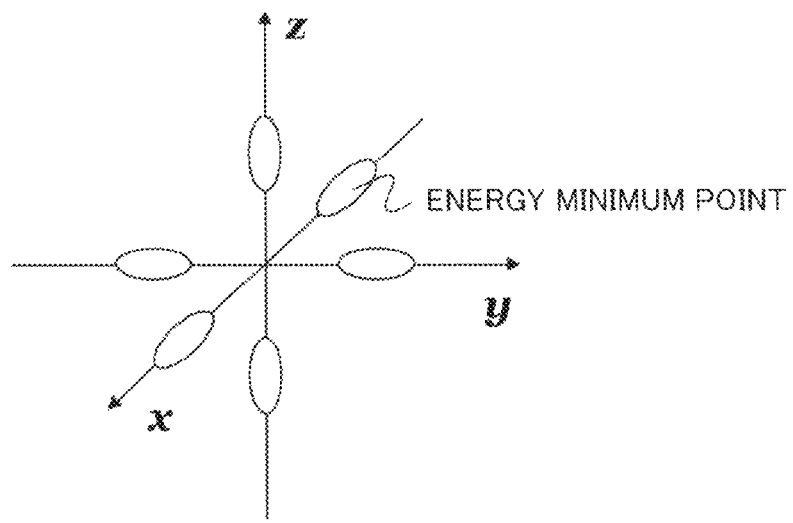
FIGS. 4A and 4B are views for explaining an operation of the stimulated phonon emission device of the first embodiment.
Figure 4B:
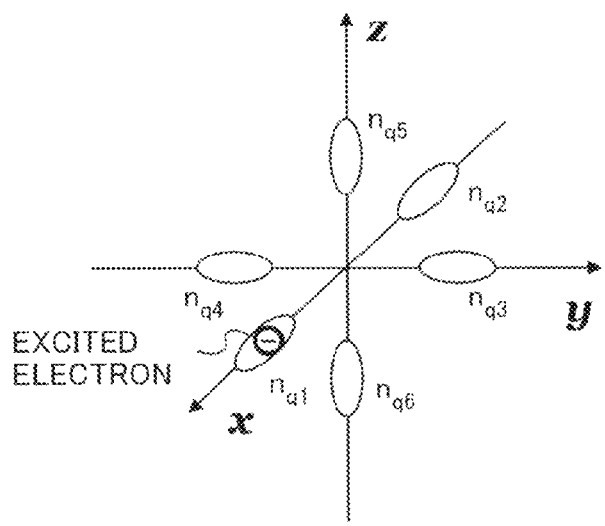

FIGS. 4A and 4B are views for explaining the operation of the stimulated phonon emission device of the present embodiment. Silicon is indirect transition type semiconductor, and due to the crystallite symmetry, minimum points of the energy in the conduction band are located in symmetric six directions from the viewpoint of the original point, as shown in FIG. 4A and are equivalent to each other. Thus, silicon is called multi-valley semiconductor. The electronic energies at the six minimum points are equal to each other, and when the electrons are excited from the valence band to the conduction band, if there is no particular reason, the probability that the electrons are excited in all the six directions is equal in the six directions.

The phonons are generated so that the change of the wave number of the electrons is compensated with the excitation of the electrons. Since the direction of the phonon to be generated is defined in the direction of the excited electrons, the probabilities of the generation of the phonon in the six directions are equal to each other.

In terms of the phonon, this elementary step can be regarded as a kind of the operation of the creation of the phonon. If any phonon does not exist in all the six directions, that is, if the respective numbers of the phonons in the six directions are $n_{q1}$, $n_{q2}$, $n_{q3}$, $n_{q4}$, $n_{q5}$, and $n_{q6}$, when the formula (2) is $$n_{q1}=n_{q2}=n_{q3}=n_{q4}=n_{q5}=n_{q6}=0,$$

the probabilities of generation of the phonon in all the directions are equal to each other (spontaneous emission of phonons). In the spontaneous emission of phonons, a direction in which the phonon is generated cannot be previously predicted.

If the numbers of the phonons in the six directions are equal to each other, even when the number of the phonons is not necessarily zero, that is, even when the formula (3) is $$n_{q1}=n_{q2}=n_{q3}=n_{q4}=n_{q5}=n_{q6}\neq 0,$$

the probabilities that the phonon is generated are equal to each other in all the six directions.

However, for some reason, if such a state that only the number of phonons in a certain direction is large is realized, for example, when only $n_{q1}$ is more than other numbers of phonons, that is, when a relation of the formula (4):

$$n_{q1}\gg n_{q2}=n_{q3}=n_{q4}=n_{q5}=n_{q6}$$

is satisfied, the probability that a phonon to be newly generated turns the same direction as $n_{q1}$ is high in comparison with other directions.

Meanwhile, when the phonon generation occurs with the impact ionization of the hot carrier, for the direction of the electron excited simultaneously with the phonon generation, the probability that the electron is excited in a specific direction is higher than the probability that the electron is excited in other directions.

For example, as shown in FIG. 4B, there are the states of phonons having directions corresponding respectively to the six energy minimum points of the electrons in the conduction band, and the numbers of the phonons in the respective states are $n_{q1}$, $n_{q2}$, $n_{q3}$, $n_{q4}$, $n_{q5}$, and $n_{q6}$.

For some reason, when the state in which only the number of phonons in a certain direction is large is realized and the relationship of the formula (4) is established, in the excited electrons generated by the impact ionization, the probability that the electrons are excited in the direction corresponding to $n_{q1}$ is higher than that in other directions. Namely, a specific directivity is given to the excited electron by the phonon.

Figure 5:
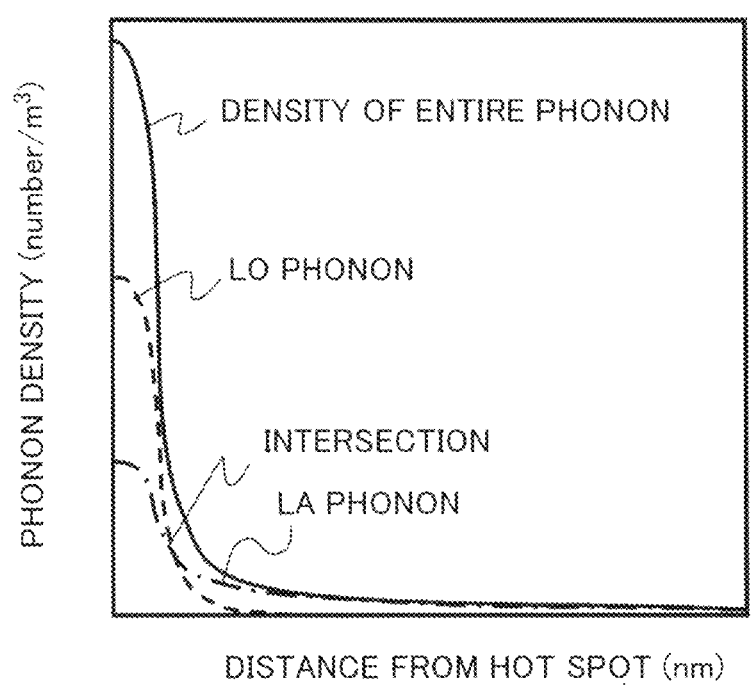
FIG. 5 is a view schematically showing a phonon density distribution near a hot spot of a transistor.

FIG. 5 is a view schematically showing a phonon density distribution near a hot spot of a transistor. In FIG. 5, the density of the entire phonon is high near the hot spot of the transistor, and the density is rapidly lowered as it is away from the hot spot. The density of a longitudinal wave optical phonon (LO phonon) is dominant near the hot spot of the transistor. The density of the longitudinal wave optical phonon (LO phonon) is rapidly lowered as it is away from the hot spot. Instead of this, the density of a longitudinal wave acoustic phonon (LA phonon) becomes relatively high.

The density of the LO phonon and the density of the LA phonon are reversed at a certain point (intersection), and at a place away from the point, a rate occupied by the density of the LA phonon is dominant relative to the density of the entire phonon. There has been known that the point at which the density of the LO phonon and the density of the LA phonon are reversed is a position away from by about 20 nm from the hot spot.

A behavior of the phonon near the hot spot can be described as follows. Namely, in the phonon created by the impact ionization, the LO phonon is dominant. However, the LO phonon is apt to stay near the hot spot by some reasons such as (1) a slow group velocity and (2) the ease of the occurrence of Umklapp scattering. Namely, the LO phonon cannot immediately propagate to a position away from the hot spot.

However, if the LO phonon is changed to the LA phonon during repetition of collision between phonons near the hot spot, the group velocity of the LA phonon is large and approximately equal to the sound velocity; therefore, the LA phonon can quickly propagate in a crystal.

Figure 6:
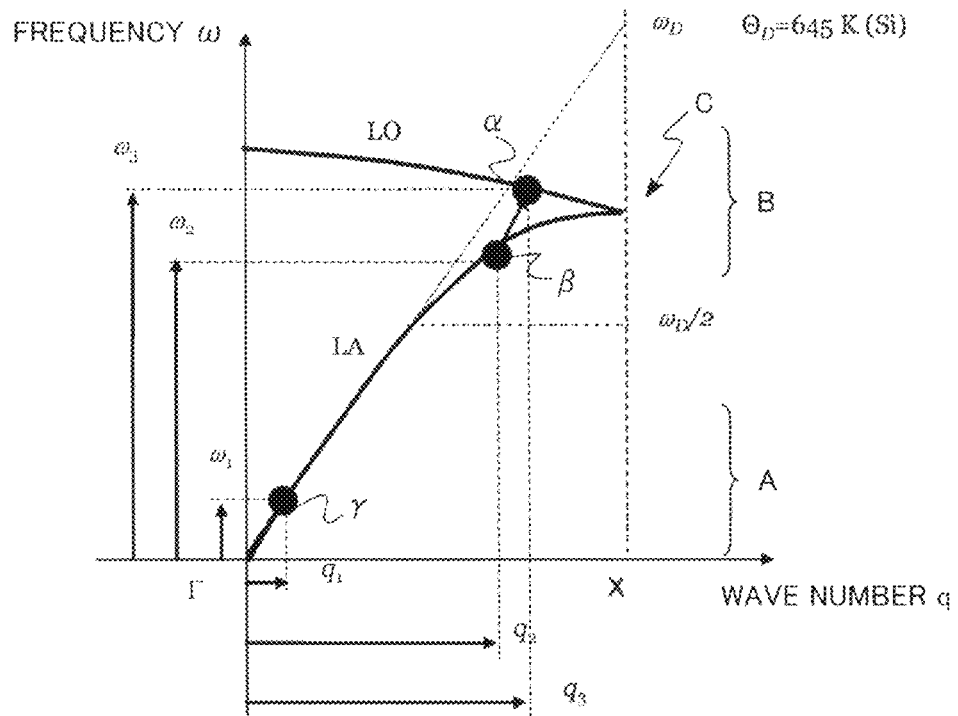
FIG. 6 is a view schematically showing a phonon dispersion curve of silicon.

FIG. 6 is a view schematically showing a phonon dispersion curve of silicon. For the sake of shorthand, FIG. 6 is limited between a Γ point to an X point, and dispersion curves of transverse wave phonons (TA phonon and TO phonon) are omitted.

In a region A showing a phonon having a low frequency, a wave number q of the phonon and an angular frequency ω have a proportional relation, and the inclination of FIG. 6 corresponds to the sound velocity of the longitudinal wave acoustic wave propagating in a crystal. In the following description, the phonon belonging to the region A is referred to as a low energy phonon or merely referred to as a "sound".

The wave number q of the low energy phonon and the angular frequency ω have a proportional relation, and the frequency at a point fitted out to a zone boundary is referred to as a Debye frequency $\omega_D$. A Debye temperature and the Debye frequency have the following relationship:

$$\Theta \omega_D = k \hbar_D \quad \text{[Formula (5)]}$$

where k is a Boltzmann constant, $\Theta$ is a reduced Planck's constant. The Debye temperature $\theta_D$ is an index showing a thermal property of a crystal, and there has been known that the Debye temperature $\theta_D$ in silicon is 645 K.

In a region B showing the phonon having a high frequency, the wave number q of the phonon and the angular frequency ω do not necessarily have a proportional relation. The inclination of the dispersion curve corresponds to the group velocity of the phonon, and the energy of the phonon can propagate in a crystal with only a velocity smaller than the sound velocity. In the following description, the phonon belonging to the region B is referred to as a high energy phonon or merely referred to as a "heat".

The high energy phonons collide with each other, whereby the travelling direction is inverted (Umklapp scattering). In order to cause the Umklapp scattering, there has been known that at least the frequency of at least one of the phonons colliding with each other frequency is required to be not less than ½ of the Debye frequency $\omega_D$. Thus, in the following description, the high energy phonon ("heat") and the low energy phonon ("sound") are classified by whether the frequency is not less than $\omega_D/2$ as a matter of convenience. The Debye temperature $\theta_D$ of silicon is 645 K, so that it is considered that the high energy phonon and the low energy phonon are mixed to the same extent in thermal equilibrium at a room temperature (300 K).

Although the high energy phonon includes the LO phonon and the LA phonon, the two kinds of phonons are degenerated in a zone boundary C. In the phonon in the degenerated state, the LO phonon and the LA phonon cannot be distinguished.

For the process of decomposing a large amount of high energy LO phonons, generated in the hot spot of the transistor, into the LA phonons, a change among three states α, β, and γ on the schematic dispersion curve shown in FIG. 6 can be exemplified as an example of the decay process. The an harmonic conversion process between the phonons is required to satisfy an energy conservation law and a momentum conservation law, that is, the following relation:

$$\omega_{LO} = \omega_{LA1} + \omega_{LA2} \quad \text{[Formula (6)]}$$

$$q_{LO} = q_{LA1} + q_{LA2} \quad \text{[Formula (6)]}$$

where the frequency and the wave number of the LO phonon α are represented respectively as $\omega_{LO}$ and $q_{LO}$, the frequency and the wave number of the high energy (high wave number) LA phonon β are represented respectively as $\omega_{LA1}$ and $q_{LA1}$, and the frequency and the wave number of the low energy (low wave number) LA phonon γ are represented respectively as $\omega_{LA2}$ and $q_{LA2}$. It is assumed that the frequency $\omega_{LA1}$ and the wave number $q_{LA1}$ of the high energy (high wave number) LA phonon β are satisfactorily larger than the frequency $\omega_{LA2}$ and the wave number $q_{LA2}$ of the low energy (low wave number) LA phonon γ.

Namely, it is assumed that the formula (8):

$$\omega_{LA1} \gg \omega_{LA2}.$$

and the formula (9)

$$q_{LA1} \gg q_{LA2}$$

are established.

In the above relations, since the LA phonon and the LO phonon are degenerated in the zone boundary on the dispersion curve of silicon, such a combination of the LO phonon α and the high energy LA phonon γ that the formulae (6) and (7) are satisfied surely exists with respect to the low energy LA phonon γ having even the smallest frequency $\omega_{LA2}$ and even the smallest wave number $q_{LA2}$.

The formula (6) may be deformed as follows:

$$\omega_{LO} = \omega_{LA1} + \omega_{LA2}$$

$$\Theta \omega_{LO} = \Theta \omega_{LA1} + \Theta \omega_{LA2}$$

$$\Theta \omega_{LO} - \Theta \omega_{LA1} = \Theta \omega_{LA2}$$

$$\epsilon_{LO} - \epsilon_{LA1} = \Theta \omega_{LA2} \quad \text{[Formula (10)]}$$

In the formula (10), in the deformation from the first line to the second line, the both sides are multiplied by $\Theta$ (reduced Planck's constant), in the deformation from the second line to the third line, the term of $\Theta \times \omega_{LA1}$ is transposed from the right side to the left side, in the deformation from the third line to the fourth line, $\epsilon_{LO} = \Theta \times \omega_{LO}$, and $\epsilon_{LA1} = \Theta \times \omega_{LA1}$ are taken. $\epsilon_{LO}$ and $\epsilon_{LA1}$ represent the energy of the LO phonon α and the energy of the high energy LA phonon β, respectively.

Figure 7:
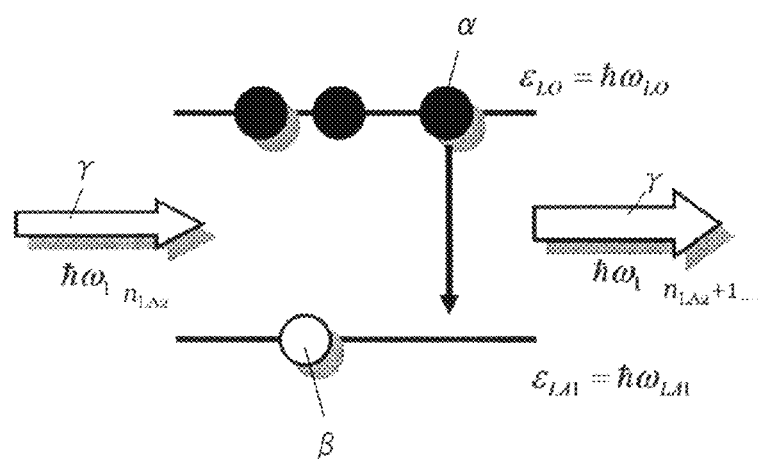
FIG. 7 is a view showing an example of a conversion process between phonons.

FIG. 7 is a view showing an example of an an harmonic decay process of a LO phonon. FIG. 7 is a view schematically showing an example of the conversion process between the LO phonon and the LA phonon shown by the formula (10).

When a change of state occurs from the LO phonon α to the high energy LA phonon β, spontaneous and stimulated emission of the low energy LA phonon γ, that is, "sound" may occur.

The low energy LA phonon γ is also a type of boson, and the creation process can be regarded as a kind of a quantum-mechanical operation leading to such a change that the number of the phonons is increased by one. Namely, the process obeys the formula (1). Thus, when $n_{LA2}$ low energy LA phonon γ enter, the number is increased to $n_{LA2}+1$ by the stimulated emission, and the "sound" is amplified.

As a condition that the "sound" is amplified by the stimulated emission, $n_{LO}$ that is the number of the LO phonons α is larger than $n_{LA1}$ that is the number of the high energy LA phonon β, and namely, $n_{LA0} > n_{LA1}$ (11). This condition corresponds to a population inversion condition in laser oscillation.

As described above, the present inventors have found that the LO phonon created with impact ionization of the hot carrier in the indirect transition type semiconductor crystal can realize the stimulated emission of the low energy LA phonon corresponding to an acoustical wave.

As shown in FIG. 1B, in this embodiment, a field-effect transistor as a generation source of the phonon according to the hot carrier is surrounded by the element isolation region 14 deeper than a well.

The field-effect transistor functions as a mechanism to facilitate impact ionization (phonon source) and a wave number conversion for phonons, and the element isolation region 14 functions as an acoustic reflecting structure.

The element isolation region 14 is embedded with an insulator, for example. The phonon generated in the field-effect transistor and reaching an interface between the semiconductor substrate 10 and the element isolation region 14 is reflected due to differences in a density and an elastic constant between a semiconductor crystal constituting the semiconductor substrate 10 and the insulator embedding the element isolation region 14.

It is preferable that the depth d (FIG. 1B) of the element isolation region 14 functioning as the acoustic reflecting structure is not less than a predetermined depth in terms of enhancement of a reflection amount of an acoustical wave. Further, it is preferable that a side surface of the element isolation region 14 is substantially vertical to a surface of the semiconductor substrate 10 in terms of enhancement of the reflection amount of the acoustical wave.

Figure 8A:
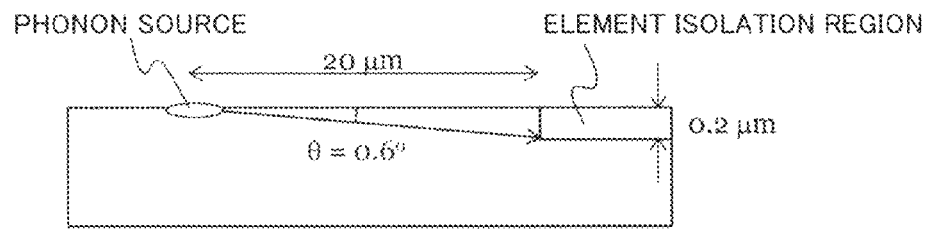
FIGS. 8A to 8C are views showing a relationship between a depth of an element isolation region and radiation characteristics.
Figure 8B:
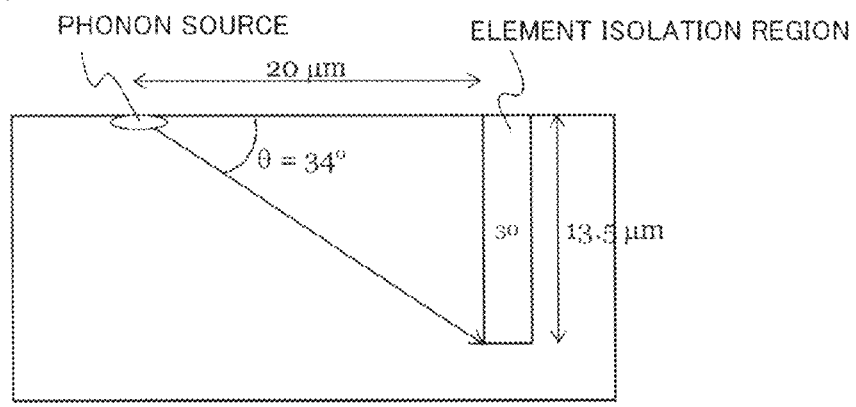
Figure 8C:
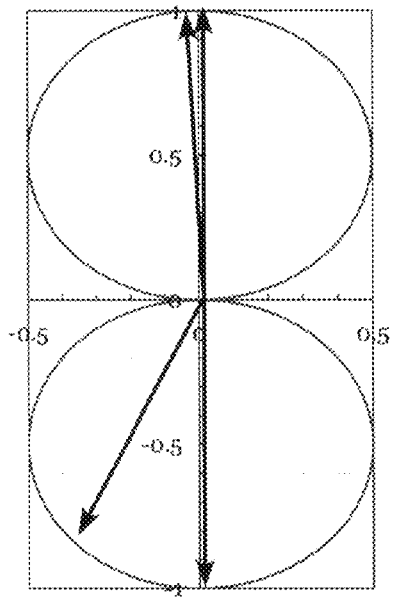

FIGS. 8A to 8C are views showing a relation between the depth of the element isolation region and radiation characteristics. FIG. 8A is a cross-sectional schematic diagram when the depth of the element isolation region is small, FIG. 8B is a cross-sectional schematic diagram when the depth of the element isolation region is large, and FIG. 8C shows the radiation characteristics in these cases.

As shown in FIG. 8A, the element isolation region having a small depth of 0.2 µm is disposed at a position away by 20 µm from a phonon source, and when this region is used as the acoustic reflecting structure, an angle where the acoustic reflecting structure seen from a phonon source is calculated corresponds to about 0.6°. Meanwhile, as shown in FIG. 8B, the element isolation region having a large depth of 13.5 µm is disposed at a position away by 20 µm from the phonon source, and when this region is used as the acoustic reflecting structure, the angle where the acoustic reflecting structure seen from the phonon source is calculated corresponds to about 34°.

For the sake of simplicity, as the radiation characteristic of the phonon from the phonon source is shown in FIG. 8C, it is assumed that radiant intensity is proportional to cos θ with respect to a radiation angle θ. By virtue of the adoption of the deep element isolation region, dissipation of the phonons can be significantly reduced, and the phonons can be effectively reflected, so that the reflection amount is expected to increase to about 50 times. Consequently, the phonon generation efficiency of the phonon source can be enhanced.

As described above, the phonon source is disposed in the indirect transition type semiconductor crystal, and the both ends are held by the acoustic reflecting structures, whereby the "sound" is confined between the structures, and a standing wave is excited. When a distance between the acoustic reflecting structures is represented by L, the frequency at which the standing wave is excited is $$f_{LA2} = \frac{v_{LA}}{L} \quad \text{[Formula (12)]}$$

provided that, $v_{LA}$ is the group velocity (sound velocity) of the low frequency LA phonon.

By virtue of the provision of the reflecting structure of the "sound", the acoustic waves with a particular wavelength satisfying the formula (12) reinforce each other. This corresponds to the increase in the number of the low energy (frequency) LA phonons γ (FIGS. 6 and 7).

Accompanying this, in FIG. 7, an opposite process to the above process is performed, and, namely, the high energy LA phonon β absorbs the low energy LA phonon γ, and the probability that the LO phonon α is excited becomes high. When the number of the LO phonons thus increases, the process shown in FIG. 2, that is the probability of the stimulated emission of the LO phonons due to the impact ionization of hot electrons becomes high.

A positive feedback loop can be established by the energy supplied from the hot carried according to a series of process. This corresponds to the excitation of the standing wave in the acoustic reflecting structure. Accordingly, according to the constitution of this embodiment, the probability of the impact ionization associated with the stimulated phonon emission can be increased, and a stimulated phonon emission device with a high efficiency can be provided.

FIG. 9 is a view showing a depth dependency of the amplitude in a surface acoustic wave (Rayleigh wave) as one embodiment of acoustical wave propagation. The horizontal axis represents values representing a depth from a surface with the ratio between an actual depth z and a wavelength λ of an acoustical wave, and the vertical axis represents the amplitudes of the acoustical wave. As shown in FIG. 9, when the amplitude of the outermost surface is maximum and as the depth increases, the amplitude attenuates.

When the depth is more than 0.3 times the wavelength, the amplitude starts to substantially monotonously attenuate. Accordingly, in terms of effective reflection of the acoustic standing waver, the depth d of the element isolation region 14 is preferably not less than 0.3 times the wavelength of the acoustic standing waver, more preferably not less than 0.45 times, still more preferably not less than 1.0 times where the amplitude substantially completely attenuates.

As in the present embodiment, in a stimulated phonon emission device including a field-effect transistor having a single gate electrode, the wavelength of the acoustic standing wave is a length L in the gate length direction of the element region 16 (FIG. 1A).

Thus, the depth of the element isolation region 14 is preferably not less than 0.3 times the length in the gate length direction of the element region 16, more preferably not less than 0.45 time, still more preferably 1.0 times where the amplitude substantially completely attenuates.

According to the stimulated phonon emission device of the present embodiment, a high efficiency stimulated phonon emission device can be realized with a simple structure, using a typical semiconductor process.

In this embodiment, since the element isolation region 14 is deeper than the well 12, holes generated by the hot carrier can be effectively confined in the well 12. Accordingly, for example when the stimulated phonon emission device of this embodiment is used in an oscillator using a substrate current, the efficiency of the oscillator can be enhanced. Further, it is possible to prevent the generated holes from adversely affecting the operations of the other elements around the device.

Figure 10:
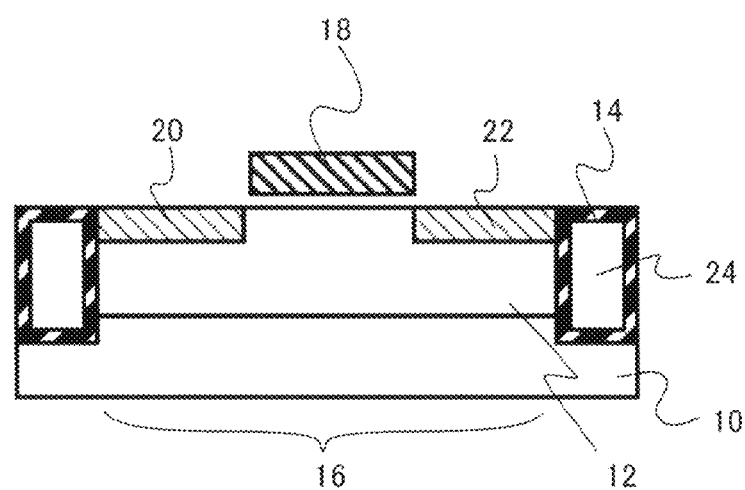
FIG. 10 is a view schematically showing a configuration of a stimulated phonon emission device of a variation of the first embodiment.

FIG. 10 is a view schematically showing a configuration of a stimulated phonon emission device of a variation of the present embodiment. The element isolation region 14 includes a cavity 24. By virtue of the provision of the cavity 24, a ratio of an acoustic impedance is increased by differences in density and elastic constant of the semiconductor substrate and the element isolation region, and the reflectance of the acoustical wave can be enhanced. Accordingly, a stimulated phonon emission device with a higher efficiency can be realized.

Second Embodiment

Stimulated phonon emission device of this embodiment is provided with a semiconductor substrate of an indirect transition type semiconductor crystal, an element region provided in the semiconductor substrate, a single gate electrode formed in an element region, a field-effect transistor having a source region and a drain region provided in an element region on the both sides of the gate electrode, and end portions which are provided on at least the both sides of the gate electrode and is substantially parallel to an extending direction of the gate electrode and further provided with a first element isolation region having a depth of not less than 0.3 times the length in the gate length direction of the element region.

The stimulated phonon emission device of this embodiment is different from the first embodiment in that a well which is of an opposite electroconductive type to the semiconductor substrate is not provided. The principles associated with the stimulated phonon emission are similar to those in the first embodiment. Accordingly, the description of the contents overlapped with those of the first embodiment is omitted.

FIGS. 11A to 11C are views schematically showing a configuration of the stimulated phonon emission device of this embodiment. FIG. 11A is a plan view of the stimulated phonon emission device. FIG. 11B is a cross-sectional view along a line A-A of FIG. 11A. FIG. 11C is a cross-sectional view along a line B-B of FIG. 11A.

For example, there is provided an n-type field-effect transistor having an n-type source region 20 and an n-type drain region 22 provided in a p-type semiconductor substrate 10. The semiconductor substrate 10 is provided with end portions which are provided on the both sides in a channel length direction of a single gate electrode 18 and are substantially parallel to the gate electrode 18 and further provided with a first element isolation region 14a having a depth of not less than 0.3 times the length L in the gate length direction of the element region 16.

A wavelength λ of an acoustic standing wave excited by the stimulated phonon emission device of this embodiment is equal to a length L in the gate length direction of the element region 16. Accordingly, the depth d of the element isolation region 14a is not less than 0.3 times the wavelength of the acoustic standing wave, so that an acoustical wave can be effectively reflected.

As shown in FIG. 11C, a second element isolation region 14b having a depth s shallower than the first element isolation region 14a is provided in a gate width direction of the gate electrode 18. Since an end portion of the element isolation region in the gate width direction is not directly involved in the reflection of the acoustical wave, the shallow element isolation region 14b can be thus provided.

According to the stimulated phonon emission device of the present embodiment, a high efficiency stimulated phonon emission device can be realized with a simple structure, using a typical semiconductor process.

The deep element isolation region 14a is provided in only a region required as an acoustic reflecting structure. Accordingly, a cost required for the formation of the deep element isolation region 14a can be reduced, for example.

It is preferable that the first element isolation region 14a has a cavity in terms of enhancement of the reflectance of the acoustical wave.

Third Embodiment

A stimulated phonon emission device of this embodiment is similar to the second embodiment except that a semiconductor substrate is an SOI substrate having an embedded insulating layer and an element isolation region has a depth reaching an embedded layer. Accordingly, the description of the contents overlapped with those of the second embodiment is omitted.

FIGS. 12A to 12C are views schematically showing a configuration of the stimulated phonon emission device of this embodiment. FIG. 12A is a plan view of the stimulated phonon emission device. FIG. 12B is a cross-sectional view along a line A-A of FIG. 12A. FIG. 12C is a cross-sectional view along a line B-B of FIG. 12A.

For example, the semiconductor substrate 10 is an SOI substrate and includes an embedded insulating layer 28. A field-effect transistor is provided in an SOI layer 30 of the semiconductor substrate 10.

According to the stimulated phonon emission device of the present embodiment, a high efficiency stimulated phonon emission device can be realized with a simple structure, using a typical semiconductor process.

A channel region (well region) of the field-effect transistor is surrounded by an element isolation region 14 and the embedded insulating layer 28. Accordingly, holes generated by a hot carrier can be effectively confined in a well, for example. Thus, for example when the stimulated phonon emission device of this embodiment is used in an oscillator using a substrate current, the efficiency of the oscillator can be enhanced. Further, it is possible to prevent the generated hole from adversely impacting the operations of the other elements around the hole.

Fourth Embodiment

A stimulated phonon emission device is provided with a first electroconductive type of semiconductor substrate of an indirect transition type semiconductor crystal, a second electroconductive type of well region provided in the semiconductor substrate, an element isolation region deeper than the well region, an element region surrounded by the element isolation region, a plurality of gate electrodes which are formed in the well region in the element region, are parallel to each other, and are arranged at a constant pitch, and a field-effect transistor having first electroconductive type of source region and drain region provided in the element regions on the both sides of the gate electrode.

The stimulated phonon emission device of this embodiment is different from the first embodiment in that the plurality of gate electrodes which are so-called multi-finger type field-effect transistors are provided. This embodiment is similar to the first embodiment except that the plurality of gate electrodes is provided. Accordingly, the description of the contents overlapped with those of the first embodiment is omitted.

Figure 13B:
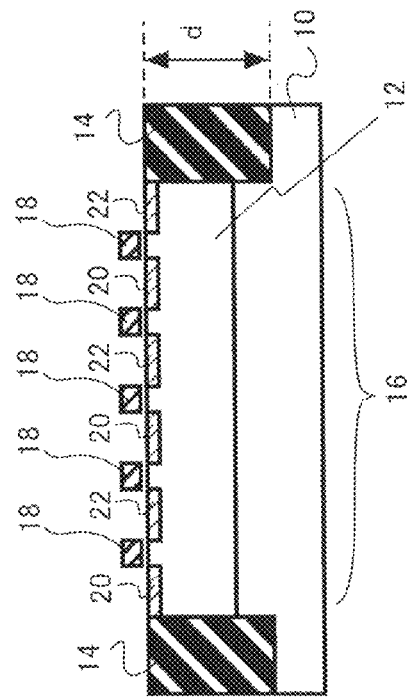
FIGS. 13A and 13B are views schematically showing a configuration of a stimulated phonon emission device of the fourth embodiment.
Figure 13A:
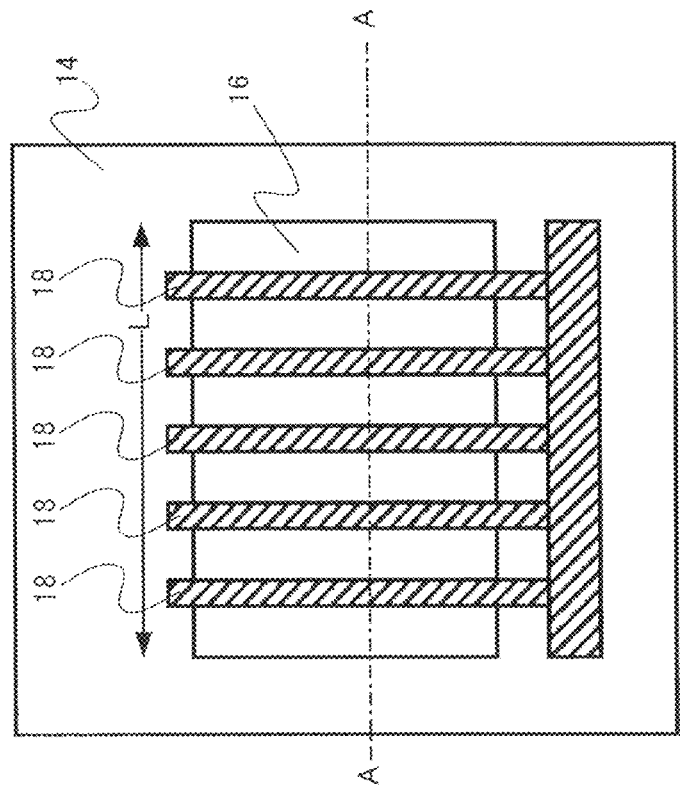

FIGS. 13A and 13B are views schematically showing a configuration of the stimulated phonon emission device of this embodiment. FIG. 13A is a plan view of the stimulated phonon emission device, and FIG. 13B is a cross-sectional view along a line A-A of FIG. 13A.

As shown in FIG. 13B, the stimulated phonon emission device is provided with a first electroconductive type of semiconductor substrate 10 as an indirect transition type of semiconductor crystal. For example, the semiconductor substrate 10 is made of n-type silicon. As the semiconductor substrate 10, in addition to silicon, other indirect transition type of semiconductor crystals such as germanium may be applied. A semiconductor crystal having a different electroconductive type from that of the semiconductor substrate 10 may be provided in a lower portion of the semiconductor substrate 10. In this case, the semiconductor substrate 10 corresponds to an n-type deep well formed in p-type silicon.

A well region 12 which is of a second electroconductive type is provided in the semiconductor substrate 10. The well region 12 is of a p-type, for example.

The semiconductor substrate 10 further includes an element separation region 14 whose depth d from an upper surface of the semiconductor substrate 10 is larger than the depth of the well region 12. The element isolation region 14 is embedded with an insulating film, for example, a silicon oxide film. The element isolation region 14 functions as an acoustic reflecting structure.

The semiconductor substrate 10 furthermore includes an element region 16 surrounded by the element isolation region 14. The well region 12 is provided in the element region 16.

A field-effect transistor is provided in the well region 12 in the element region 16. The field-effect transistor is provided with a plurality of the gate electrodes 18 which are parallel to each other, are arranged at a constant pitch, and are electrically common. In this example, the number of the gate electrodes 18 is five.

The field-effect transistor is provided with an n-type source region 20 and a drain region 22 provided in element regions 12 on the both sides of the gate electrode 18.

The gate electrode 18 is provided on the element region 12 through a gate insulating film (not shown).

FIGS. 14A and 14B are explanatory views of an acoustic standing wave excited by the stimulated phonon emission device of this embodiment. FIG. 14A is a cross-sectional view, and FIG. 14B is a waveform of the acoustic standing wave.

As shown in FIG. 14, the wavelength $\lambda$ of the excited acoustic standing wave is equal to the pitch of the gate electrodes 18.

Accordingly, in terms of effective reflection of the acoustic standing waver, the depth d of the element isolation region 14 is preferably not less than 0.3 times the pitch of the gate electrodes 18, more preferably not less than 0.45 times, still more preferably not less than 1.0 times where the amplitude substantially completely attenuates.

Figure 15:
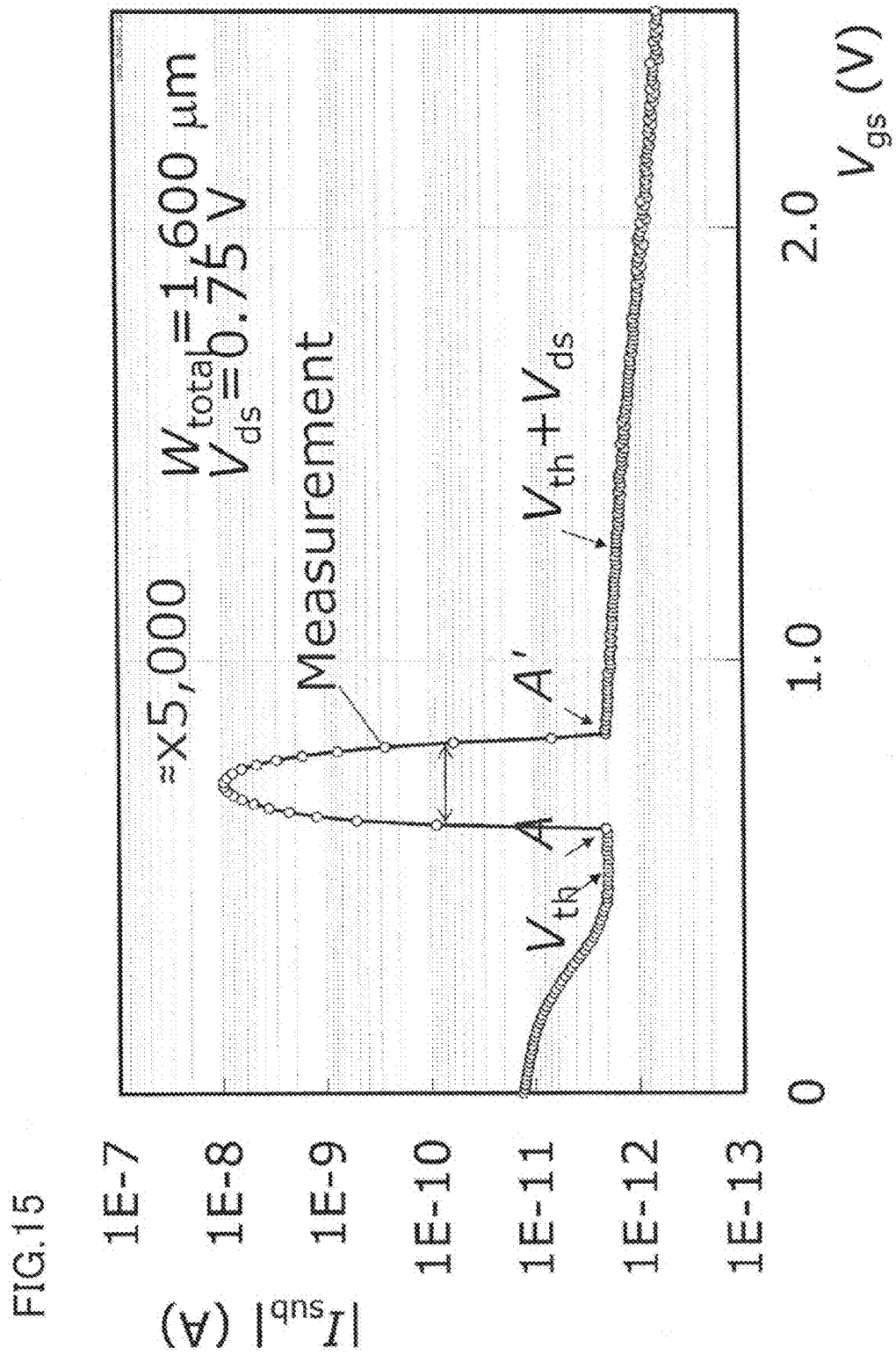
FIG. 15 is a view showing measurement results of a substrate current observed in the stimulated phonon emission device of the fourth embodiment.

FIG. 15 is a view showing measurement results of a substrate current observed in the stimulated phonon emission device of this embodiment. As shown in FIG. 15, a specific bias condition where impact-ionization occurs to generate an enhanced magnitude of substrate current is applied. More specifically, a bias condition is applied to a gate terminal, a source terminal, and a drain terminal applying voltage respectively to the gate electrode 18, the source region 20, and the drain region 22 of the field-effect transistor so that when a threshold voltage of the field effect transistor is Vth, a gate voltage Vgs applied between the source terminal and the gate terminal and a drain voltage Vds applied between the source terminal and the drain terminal satisfy a relation of Vth<Vgs<Vds+Vth, whereby an extremely high substrate current is observed. It is clear that the substrate current oscillates at a specific frequency.

As in this embodiment, by virtue of the adoption of the multi-finger type field-effect transistor, the amplitude of the acoustic standing wave to be generated becomes large, and the number of phonons to be generated is increased. Consequently, the impact ionization is promoted, and a significant increase of a substrate current and an oscillation phenomenon synchronized with a period of the acoustic standing wave are observed.

According to the stimulated phonon emission device of the present embodiment, a high efficiency stimulated phonon emission device can be realized with a simple structure, using a typical semiconductor process.

In this embodiment, since the element isolation region 14 is deeper than the well 12, holes generated by the hot carrier can be effectively confined in the well 12. Accordingly, for example when the stimulated phonon emission device of this embodiment is used in an oscillator using a substrate current, the efficiency of the oscillator can be enhanced. Further, it is possible to prevent the generated hole from adversely affecting the operations of the other elements around the hole. By virtue of the adoption of the multi-finger type field-effect transistor, the number of the phonons to be generated can be increased. Accordingly, a stimulated phonon emission device with a higher efficiency can be realized.

Figure 16:
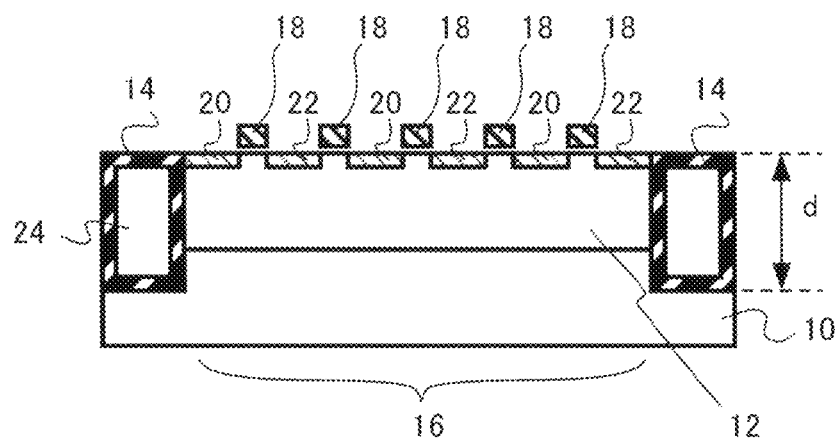
FIG. 16 is a view schematically showing a configuration of a stimulated phonon emission device of a variation of the fourth embodiment.

FIG. 16 is a view schematically showing a configuration of a stimulated phonon emission device of a variation of the present embodiment. The element isolation region 14 includes a cavity 24. By virtue of the provision of the cavity 24, the reflectance of the acoustical wave can be enhanced. Accordingly, a stimulated phonon emission device with a higher efficiency can be realized.

Fifth Embodiment

A stimulated phonon emission device of this embodiment is provided with a semiconductor substrate of an indirect transition type semiconductor crystal, an element region provided in a semiconductor substrate, a plurality of gate electrodes which are provided in an element region, are parallel to each other, and are arranged at a constant pitch, a field-effect transistor having a source region and a drain region provided in element regions on the both sides of the gate electrode, and end portions which are provided on at least the both sides of the gate electrodes and are substantially parallel to an extending direction of the gate electrode and further provided with a first element isolation region having a depth of not less than 0.3 times the pitch of the gate electrodes.

The stimulated phonon emission device of this embodiment is different from the fourth embodiment in that a well which is of an opposite electroconductive type to the semiconductor substrate is not provided. The principles associated with the stimulated phonon emission are similar to those in the fourth embodiment. Accordingly, the description of the contents overlapped with those of the fourth embodiment is omitted.

FIGS. 17A to 17C are views schematically showing a configuration of the stimulated phonon emission device of this embodiment. FIG. 17A is a plan view of the stimulated phonon emission device. FIG. 17B is a cross-sectional view along a line A-A of FIG. 17A. FIG. 17C is a cross-sectional view along a line B-B of FIG. 17A.

For example, there is provided an n-type field-effect transistor having an n-type source region 20 and an n-type drain region provided in a p-type semiconductor substrate 10. The semiconductor substrate 10 is provided with end portions which are provided on the both sides in a channel length direction of a gate electrode 18 and are substantially parallel to the gate electrode 18 and further provided with a first element isolation region 14a having a depth of not less than 0.3 times the pitch of the gate electrodes 18.

A wavelength $\lambda$ of an acoustic standing wave excited by the stimulated phonon emission device of this embodiment is equal to the pitch of the gate electrodes 18. Accordingly, the depth d of the element isolation region 14a is not less than 0.3 times the wavelength of the acoustic standing wave, so that an acoustical wave can be effectively reflected.

As shown in FIG. 17C, a second element isolation region 14b having a depth s shallower than the first element isolation region 14a is provided in a gate width direction of the gate electrode 18. Since an end portion of the element isolation region in the gate width direction is not directly involved in the reflection of the acoustical wave, the shallow element isolation region 14b can be thus provided.

According to the stimulated phonon emission device of the present embodiment, a high efficiency stimulated phonon emission device can be realized with a simple structure, using a typical semiconductor process.

The deep element isolation region 14a is provided in only a region required as an acoustic reflecting structure. Accordingly, a cost required for the formation of the deep element isolation region 14a can be reduced, for example.

By virtue of the adoption of the multi-finger type field-effect transistor, the number of the phonons to be generated can be increased. Accordingly, a stimulated phonon emission device with a higher efficiency can be realized.

It is preferable that the first element isolation region 14a has a cavity in terms of enhancement of the reflectance of the acoustical wave.

Sixth Embodiment

An oscillator of this embodiment is an oscillator provided with the stimulated phonon emission device of the fourth embodiment.

Since the structure of the stimulated phonon emission device is similar to that in the fourth embodiment, the description is omitted.

Figure 18A:
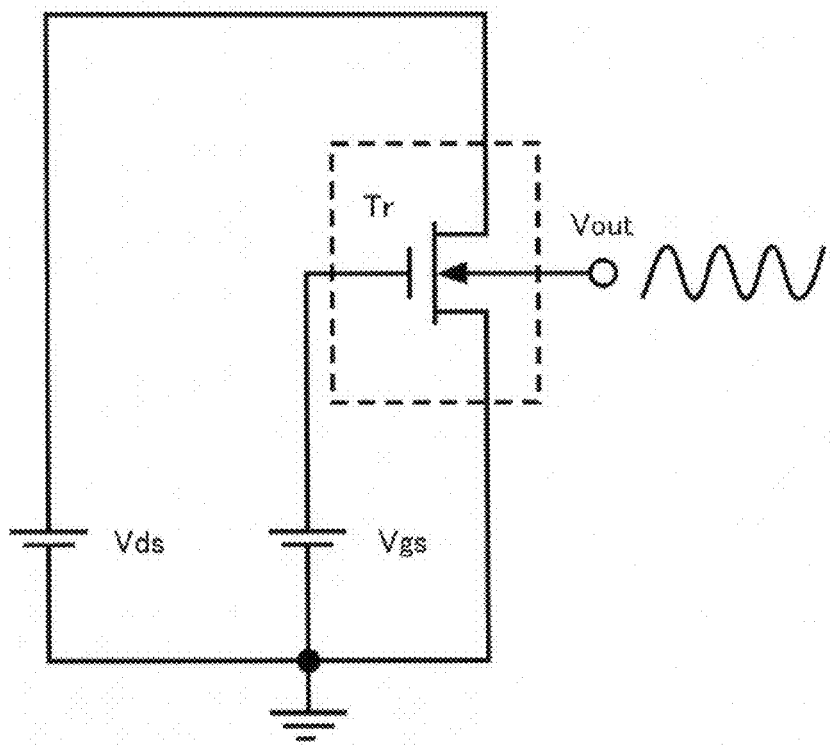
FIGS. 18A and 18B are equivalent circuit schematics of an oscillator of a sixth embodiment and views showing a frequency dependency of an impedance.

FIG. 18A is an equivalent circuit schematic of an oscillator of this embodiment. In FIG. 18A, a region surrounded by a dotted frame corresponds to the stimulated phonon emission device of the fourth embodiment. An output terminal (Vout) is taken from a well of a field-effect transistor (hereinafter also referred to simply as a transistor: Tr in the drawing).

Figure 18B:
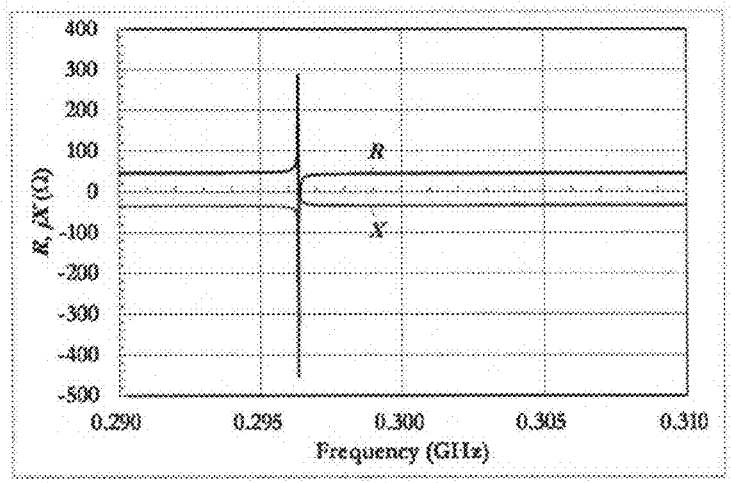

As shown in FIG. 15, in the stimulated phonon emission device of the fourth embodiment, an oscillating substrate current is generated under a specific bias condition in which conduction carriers are accelerated and thereby the impact-ionization rate is enhanced. Accordingly, a circuit configuration in which the substrate current is taken from an output terminal is provided, whereby the stimulated phonon emission device functions as an oscillator. For example, when the pitch of the gate electrodes 18 is 18 μm, the wavelength of the acoustic standing wave is λ=18 μm, and the sound velocity of the surface acoustic wave (Reilly wave) propagating in a silicone crystal is 5370 m/s, so that the oscillation frequency is about 300 MHz based on the formula (12). The frequency dependency of an impedance seen from the output terminal (well terminal) in the oscillator thus obtained is shown in FIG. 18B. Although a real part R of the impedance is a negative value with a specific frequency, this means the oscillation with the above frequency. As a Q value estimated from the rate of change of the frequency of the impedance, about 1500 is obtained. Such a high Q value cannot be realized by an LC oscillator and can be realized for the first time by utilizing the stimulated phonon emission.

According to the oscillator of the present embodiment, a high efficiency oscillator having high frequency accuracy can be realized with a simple structure, using a typical semiconductor process.

Instead of the stimulated phonon emission device of the fourth embodiment, the oscillator can be realized by applying the stimulated phonon emission device of the first, second, third, or fifth embodiment.

Seventh Embodiment

A frequency filter of this embodiment is provided with the stimulated phonon emission device of the fourth embodiment.

Since the structure of the stimulated phonon emission device is similar to that in the fourth embodiment, the description is omitted.

Figure 19:
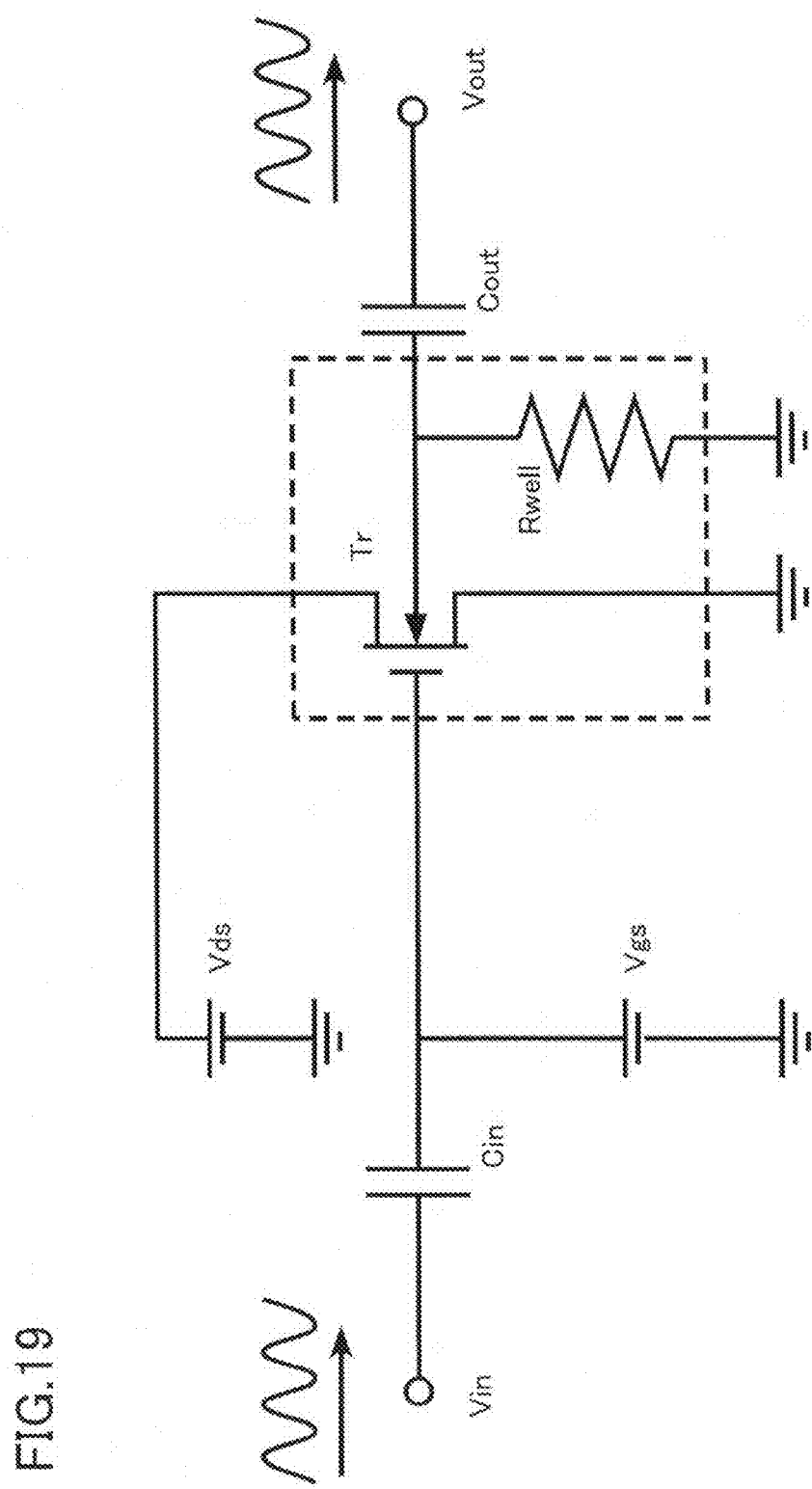
FIG. 19 is an equivalent circuit schematic of a frequency filter of the seventh embodiment.

FIG. 19 is an equivalent circuit schematic of the frequency filter of this embodiment. In FIG. 19, a region surrounded by a dotted frame corresponds to the stimulated phonon emission device of the fourth embodiment.

In a transistor Tr, a specific acoustic standing wave determined by a size of an element region and the number and arrangement of gate electrodes can be excited. DC bias voltages $V_{gs}$ and $V_{ds}$ are applied to the gate electrode and a drain region so that an electron-hole pair is generated by impact ionization. The gate electrode is connected to an input terminal $V_{in}$ through a capacitor $C_{in}$. By virtue of such a connection, an AC signal input from the input terminal $V_{in}$ is input to the gate electrode of the transistor Tr.

The transistor Tr is configured inside a different electro-conductive type semiconductor well, and a portion of the electron-hole pair generated by the impact ionization is output from a well terminal. A DC component in the well current is connected to a ground potential through a resistance $R_{well}$. An AC component is output to an output terminal $V_{out}$ through the capacitor $C_{out}$.

Figure 20:
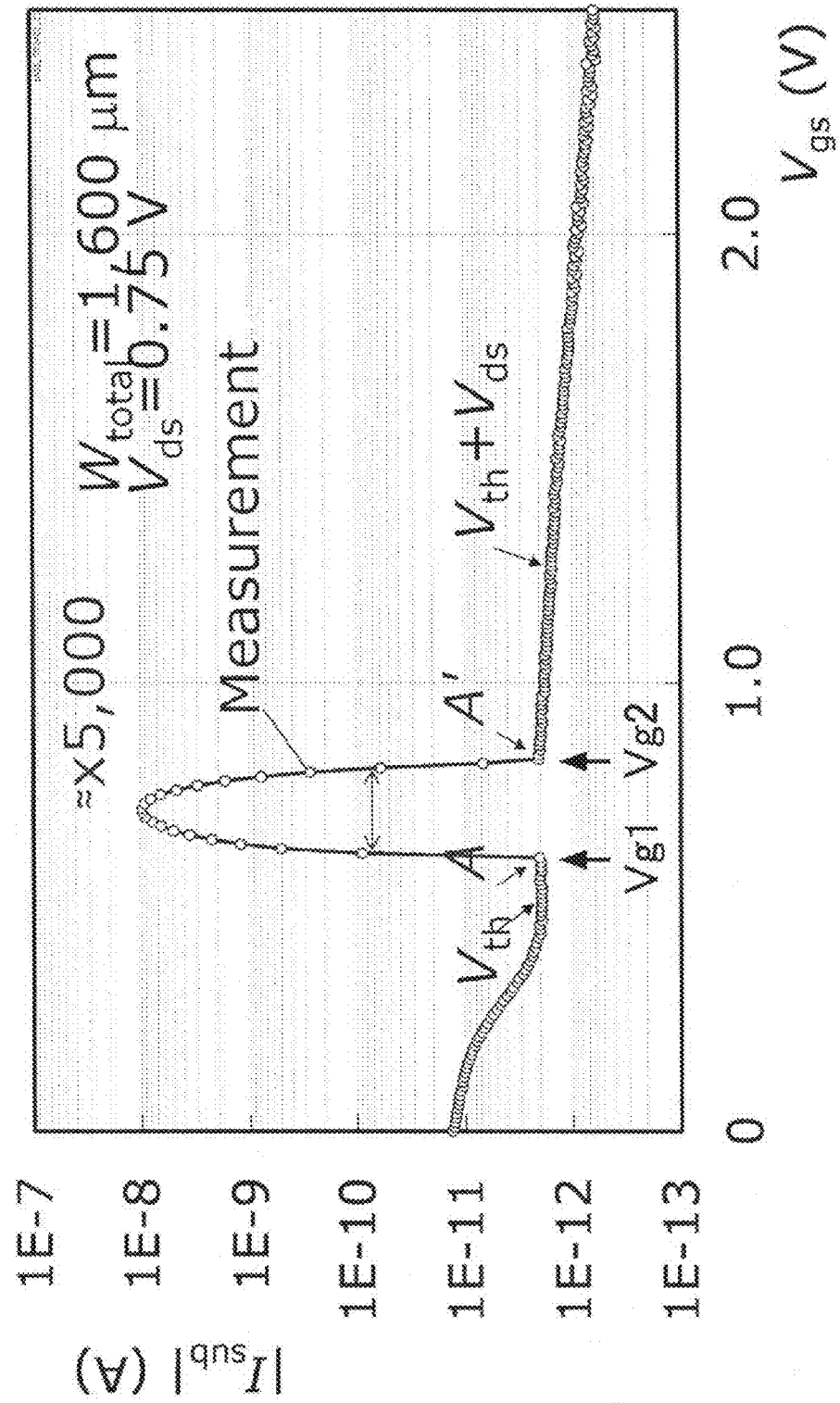
FIG. 20 is an explanatory view of an operation of the frequency filter of the seventh embodiment.

FIG. 20 is an explanatory view of an operation of the frequency filter of this embodiment. FIG. 20 shows a relation between the gate voltage $V_{gs}$ (horizontal axis) and a well current $I_{well}$ (vertical axis: logarithm) of the transistor Tr of this embodiment.

A drain voltage $V_{ds}$ is kept constant, and when the gate voltage $V_{gs}$ is changed, a well current discontinuously increases in a specific voltage range ($V_{g1}<V_{gs}<V_{g2}$), and the stimulated emission of the phonons are generated in this range. However, since a transistor oscillates in a self-excited manner under this bias condition, the transistor is not suited for use as a frequency filter.

In the frequency filter according to this embodiment, the bias condition is set near the stimulated emission condition free from the stimulated emission and, for example, set to $V_{gs}<V_{g1}$ or $V_{gs}>V_{g2}$. The former condition ($V_{gs}<V_{gs}$) is preferable in terms of low power consumption.

Figures 21A, 21B:
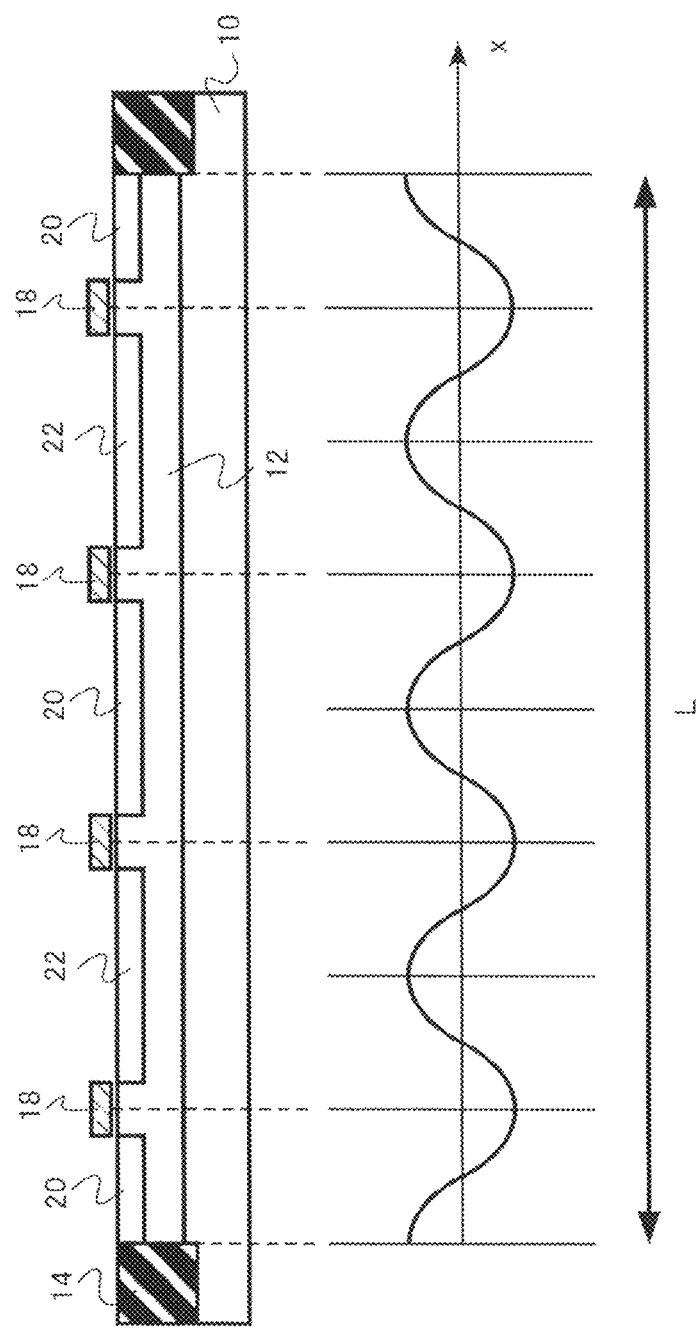
FIGS. 21A and 21B are explanatory views of a transistor used in the seventh embodiment.

FIGS. 21A and 21B are explanatory views of a transistor used in this embodiment. FIG. 21A is a cross-sectional view of the transistor, and FIG. 21B shows a waveform of an excited acoustic standing wave.

The transistor includes a gate electrode 18, a drain region 22, a source region 20, and so on. An element region of the transistor and outside are acoustically isolated by an element isolation region 14 provided around the transistor.

As shown in FIG. 21A, in the element region of the transistor, an acoustic standing wave determined by a size L of the element region and the number and arrangement of the gate electrodes 18 is excited. The phases of the standing wave coincide at the positions of the gate electrodes 18 periodically arranged. In the case of FIG. 21, the number of waves is n=4, reflecting the fact that the number of the gate electrodes is four, and a single wavelength is equal to the pitch of the gate electrodes 18. Accordingly, a unique frequency (resonance frequency $f_0$) of the transistor is given by $f_0=V_c/\lambda$, where $V_c$ is the sound velocity propagating in an Si crystal.

Figure 22:
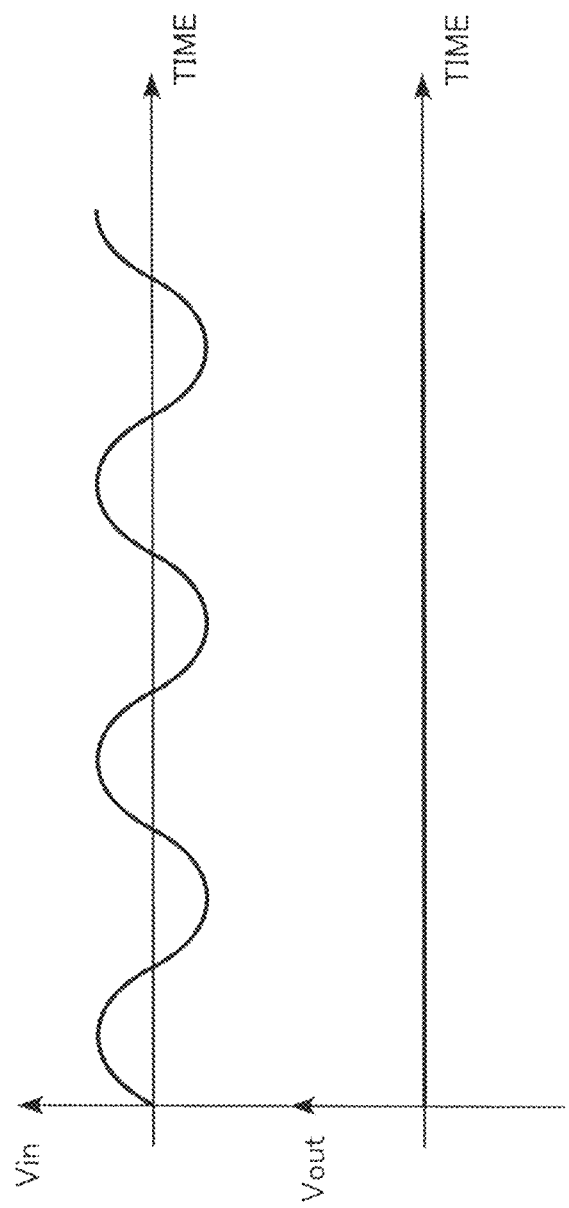
FIG. 22 is a view showing an operation of the frequency filter of the seventh embodiment.
Figure 23:
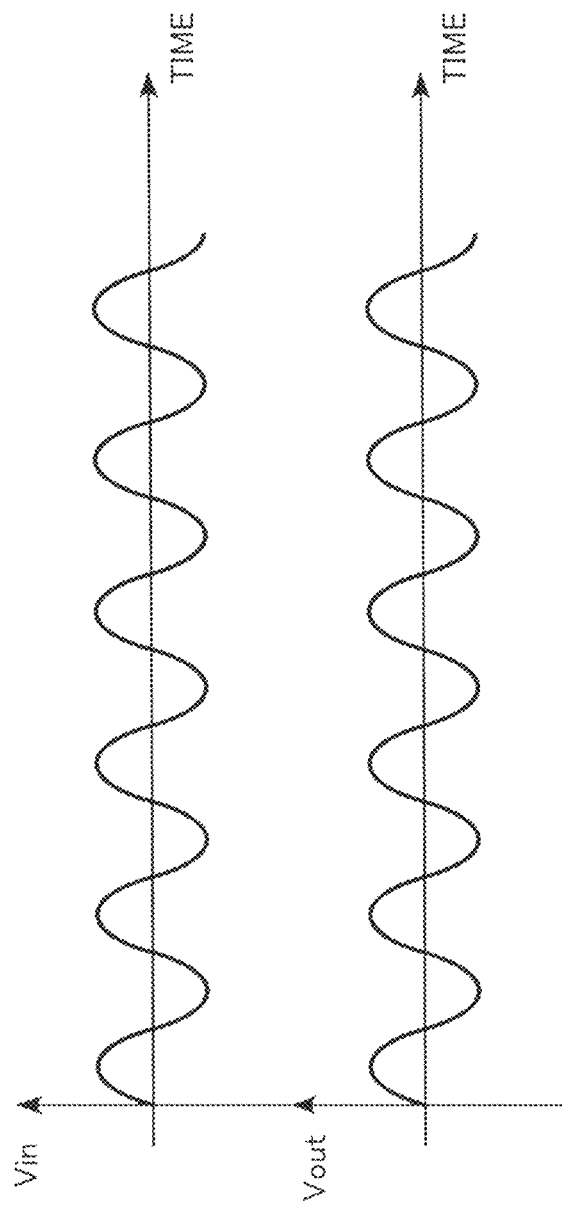
FIG. 23 is a view showing the operation of the frequency filter of the seventh embodiment.

FIGS. 22 and 23 are views showing the operation of the frequency filter of this embodiment. Even if a signal having a frequency different from the resonance frequency is input to the gate electrode 18 of the transistor Tr, an output signal of an AC component cannot be obtained as shown in FIG. 22. Meanwhile, as shown in FIG. 23, when an input signal having a frequency component the same as that of the resonance frequency of the transistor Tr is supplied, a drain current $I_d$ is periodically changed in response to the AC component added to the gate electrode.

Since a frequency of occurrence of impact ionization is proportional to the drain current $I_d$, the rate of occurrence of impact ionization is changed in synchronism with the frequency. The number of phonons generated by the impact ionization periodically changes. Moreover, an acoustic standing wave is excited in synchronism with the phonons, whereby the impact ionization rate is increased. Consequently, an AC signal having the same frequency component as the input signal is output to a well terminal.

According to the frequency filter of the present embodiment, a high efficiency frequency filter can be realized with a simple structure, using a typical semiconductor process.

Instead of the stimulated phonon emission device of the fourth embodiment, the frequency filter can be realized by applying the stimulated phonon emission device of the first, second, third, or fifth embodiment.

Eighth Embodiment

A frequency filter of this embodiment is provided with a stimulated phonon emission device.

Since a basic structure of the stimulated phonon emission device is similar to that in the first to fifth embodiments, the description is omitted.

Figure 24:
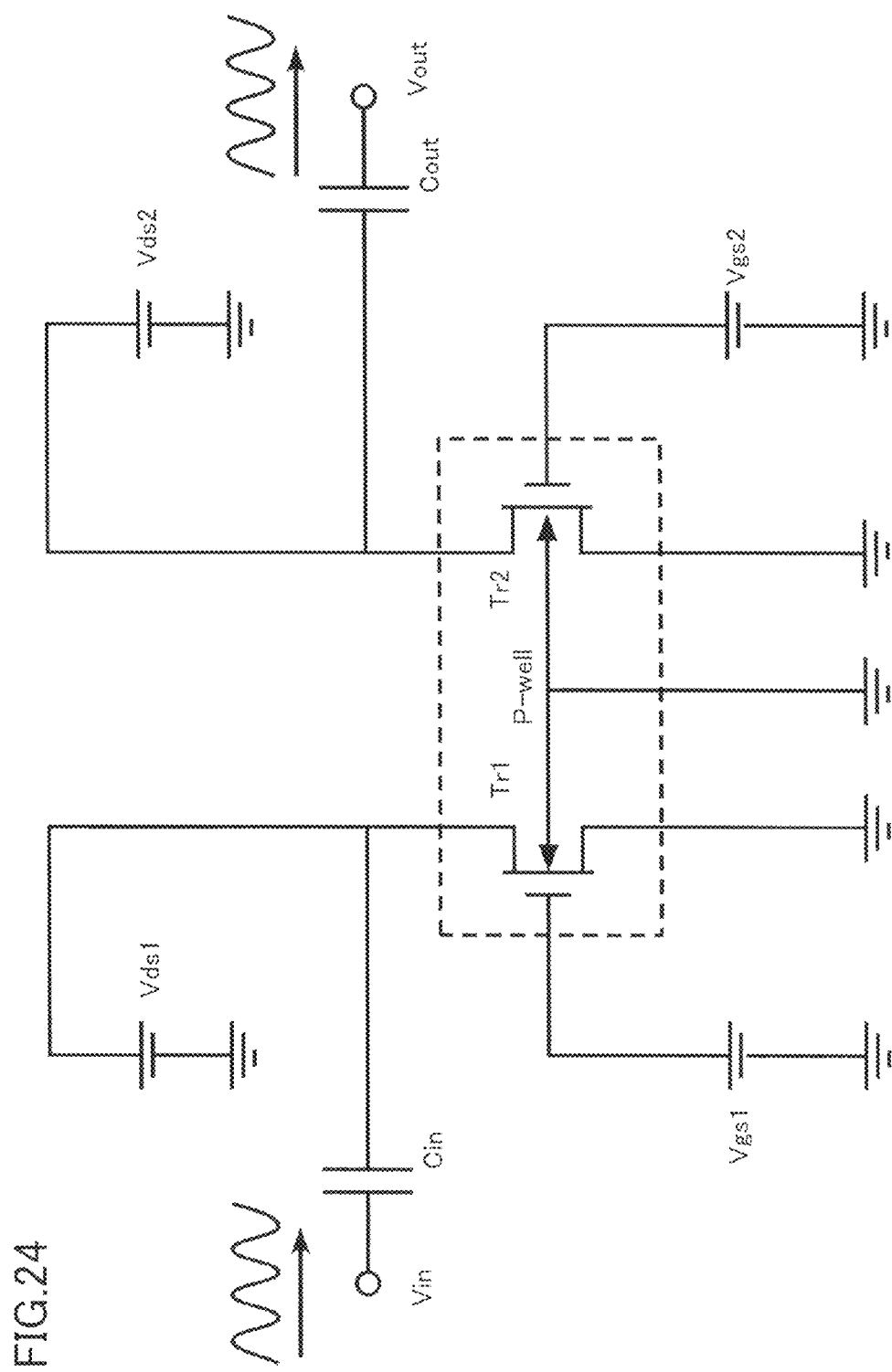
FIG. 24 is an equivalent circuit schematic of a frequency filter of the eighth embodiment.

FIG. 24 is an equivalent circuit schematic of a frequency filter of this embodiment. In FIG. 24, a region surrounded by a dotted frame corresponds to the stimulated phonon emission device.

In this embodiment, a pair of transistors $Tr_1$ and $Tr_2$ are arranged at a symmetric position in the same element region. When taking as an example FIG. 21A, gate electrodes 18 alternately constitute the gate electrodes of the transistors $Tr_1$ and $Tr_2$. Drain regions constituting the transistors $Tr_1$ and $Tr_2$ are connected respectively to an input terminal $V_{in}$ and an output terminal $V_{out}$ through capacitors $C_{in}$ and $C_{out}$.

In the constitution of this embodiment, although the transistors are not oscillated in a self-excited manner, a bias voltage under a condition close to this condition is applied to a gate voltage $V_{gs}$ and a drain voltage $V_{ds}$. When an input signal having a frequency component the same as the resonance frequency of acoustic resonance is input from the input terminal $V_{in}$, the drain current of the transistor $Tr_1$ periodically changes, and therefore, the impact ionization rate periodically changes in synchronism with the change to generate phonons, and, thus, to excite an acoustic standing wave.

Since the acoustical wave propagates to the transistor $Tr_2$ disposed in the same element region as the transistor $Tr_1$, the impact ionization rate periodically changes in the transistor $Tr_2$. Since the drain current of the transistor $Tr_2$ is periodically changed by the impact ionization, an output signal having the same frequency component is output from the output terminal $V_{out}$. Namely, the circuit functions as a frequency filter.

According to the frequency filter of the present embodiment, a high efficiency frequency filter can be realized with a simple structure, using a typical semiconductor process.

Ninth Embodiment

Cooling device of this embodiment is provided with a stimulated phonon emission device.

Since a basic structure of the stimulated phonon emission device is similar to that in the first to fifth embodiments, the description is omitted.

Figure 25:
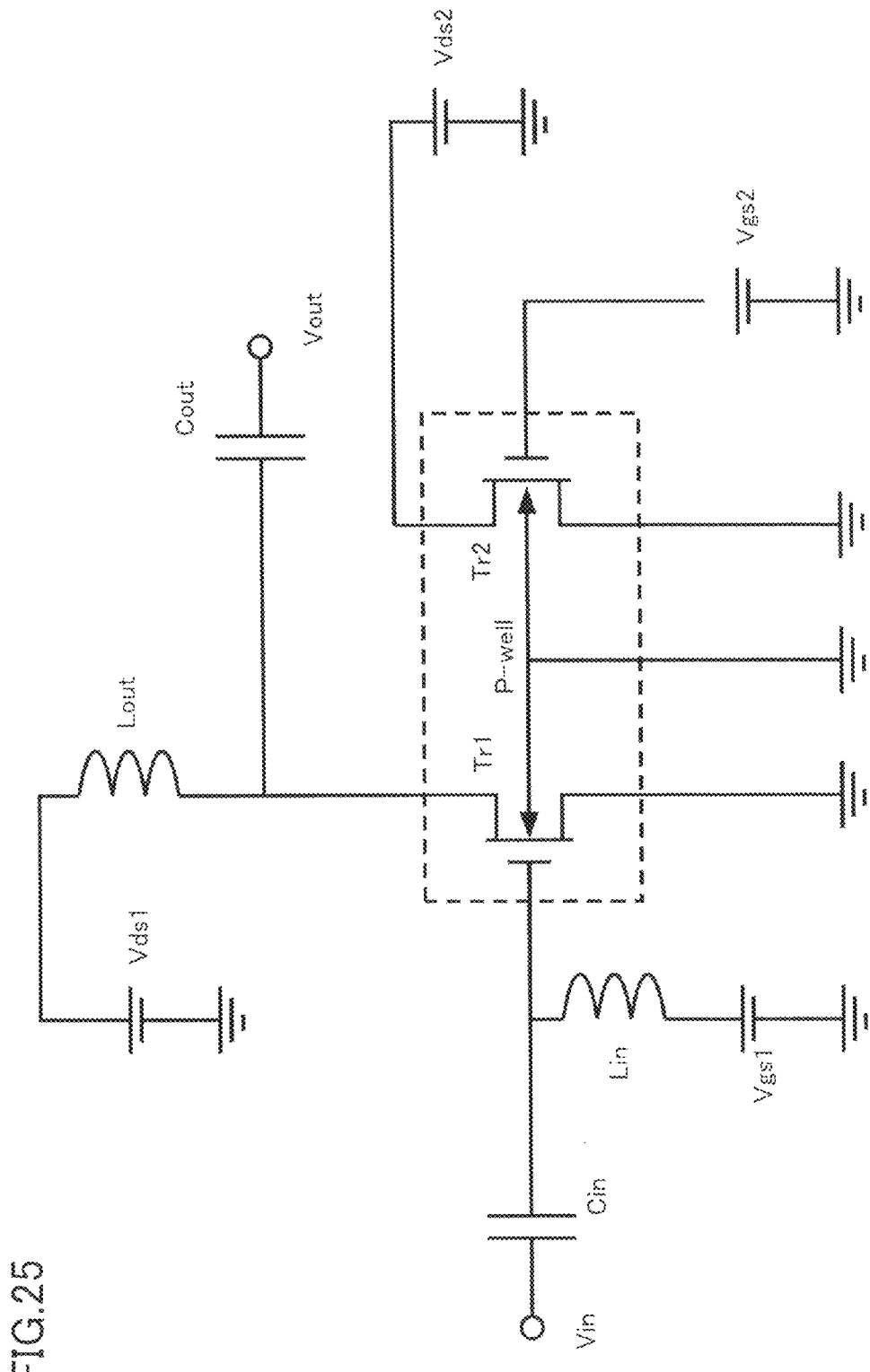
FIG. 25 is an equivalent circuit schematic of a power amplifier provided with a cooling device of the ninth embodiment.

FIG. 25 is an equivalent circuit schematic of a power amplifier provided with the cooling device of this embodiment. In FIG. 25, a region surrounded by a dotted frame corresponds to the stimulated phonon emission device.

In this circuit, a transistor $Tr_1$ constituting a high frequency power amplifier and a transistor $Tr_2$ having a cooling function are provided, and these transistors are arranged in the same element region shown by a dashed line. Gate electrodes constituting the transistors $Tr_1$ and $Tr_2$ are arranged at positions where the gate electrodes have the same phase as an acoustic standing wave excited in the element region.

An acoustic resonance frequency of the transistor is determined by a size of the element region of the transistor and the number and arrangement position of the gate electrodes. At this time, a layout of the transistor is designed so that a frequency fs of a high-frequency signal amplified by the high-frequency power amplifier is different from an acoustic resonance frequency $f_0$ and frequencies of the integral multiple of the acoustic resonance frequency. Namely, $$f_s \neq N f_0,$$

where N is an integer of 1 or more.

In the transistor $Tr_1$ used as a power amplifier, a bias voltage $V_{gs1}$ is applied to the gate electrode through an inductor $L_{in}$, and a high-frequency input signal $V_{in}$ is input through a capacitor $C_{in}$. Meanwhile, a bias voltage $V_{ds1}$ is applied to the drain region of the transistor $Tr_1$ through an inductor $L_{out}$, and a high-frequency output signal $V_{out}$ is output through a capacitor $C_{out}$.

In the transistor $Tr_2$ used as a cooling device, bias voltages $V_{gs2}$ and $V_{ds2}$ are applied respectively to the gate electrode and the drain region.

However, DC bias voltages applied to those two transistors are different from each other. In the transistor $Tr_1$ used as a power amplifier, in order to obtain a larger output signal, there is provided a bias condition in which a large amount of drain current flows. Meanwhile, in the transistor $Tr_2$ used as a cooling device, in order to reduce power consumption, the bias condition is set so that a smaller amount of drain current flows.

To explain using FIG. 20 (is a view showing a relation between a gate voltage $V_{gs}$ and a well current $I_{well}$), for example, a DC bias voltage $V_{gs1}$ higher than $V_{g2}$ is applied to the transistor $Tr_1$, and a DC bias voltage $V_{gs1}$ lower than $V_{g1}$ is applied to the transistor $Tr_2$.

When the input signal $V_{in}$ is input, the transistor $Tr_1$ amplifies the input signal $V_{in}$ and outputs an output signal to the output terminal $V_{out}$. At this time, since the frequency of the signal is different from the frequency of acoustic resonance, the frequency of the signal itself does not excite an acoustic standing wave. However, as a result of power amplification of a high-frequency signal, a large amount of heat is generated in the transistor $Tr_1$.

The heat is energy of lattice vibration of semiconductor crystal mainly composed of LO phonons having various frequency contents. In the LO phonon, since the group velocity (energy propagation velocity) is extremely small in comparison with a propagation velocity of an acoustical wave, movement of heat energy in a crystal is slow (thermal conductivity is small). Thus, a temperature of the transistor $Tr_1$ is locally increased.

However, a portion of the frequency component of the heat energy generated by the transistor $Tr_1$ includes a component corresponding to a higher harmonic wave having an acoustic resonance frequency. Since a dispersion curve of phonons includes nonlinearity, such a higher harmonic wave is decomposed into LA phonons having a plurality of frequency components, whereby an acoustic standing wave is excited in the element region of the transistor. At this time, reflecting a difference in the bias condition and the presence of input of a high-frequency signal, in the transistor $Tr_1$ the density $n_1$ of phonons is high, and in the transistor $Tr_2$ the density $n_2$ of phonons is low. Namely, a relation of $n_1 \gg n_2$ is established.

A portion of the heat energy moves from the transistor $Tr_1$ to the transistor $Tr_2$ through a form of the LA phonon so as to eliminate a difference in the phonon density between the transistors acoustically coupled to each other, which is thus generated. Consequently, the temperature of the transistor $Tr_1$ is reduced. Namely, in this case, the transistor $Tr_2$ functions as a cooling device.

According to the cooling device of this embodiment, a high-efficiency cooling device can be realized with a simple structure, using a typical semiconductor process.

Tenth Embodiment

Light-receiving device of this embodiment is provided with a stimulated phonon emission device.

Since a basic structure of the stimulated phonon emission device is similar to that in the first to fifth embodiments, the description is omitted.

Figure 26:
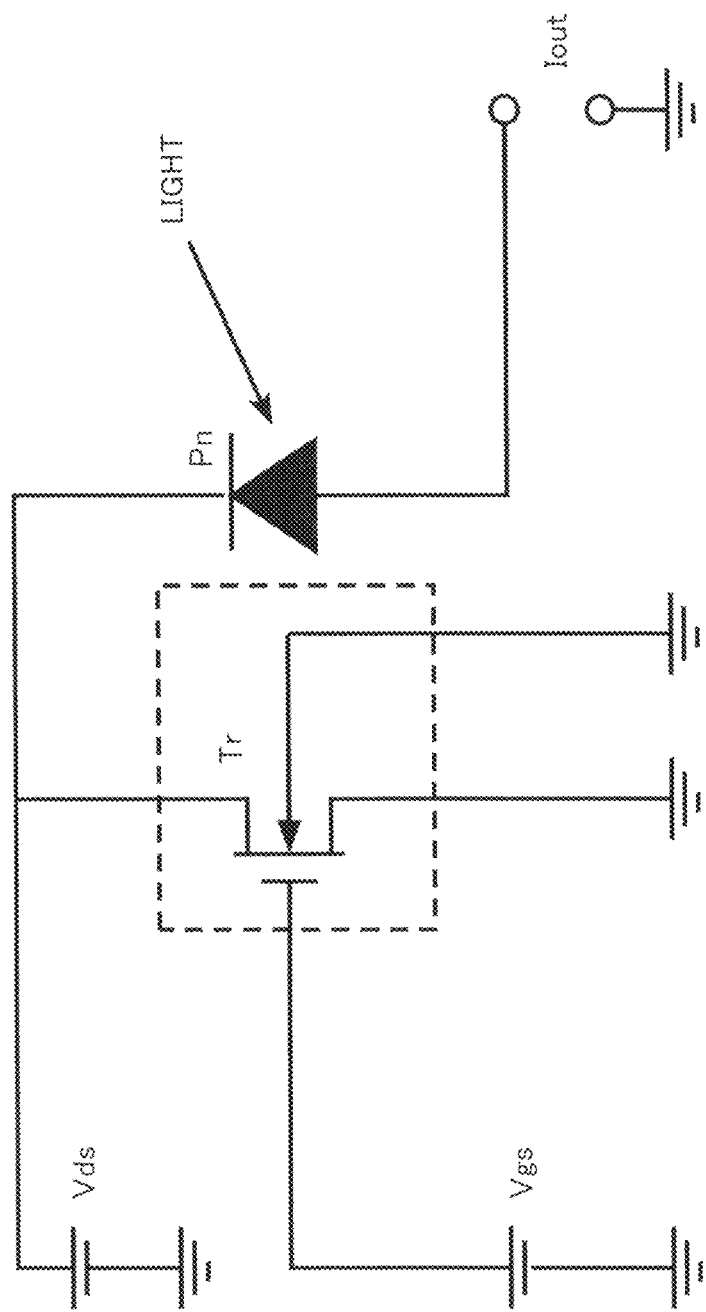
FIG. 26 is an equivalent circuit schematic of a light-receiving device of the tenth embodiment.

FIG. 26 is an equivalent circuit schematic of the light-receiving device of this embodiment. In FIG. 26, a region surrounded by a dotted frame corresponds to the stimulated phonon emission device.

In the light-receiving device of this embodiment, a transistor Tr serving as a stimulated phonon emission device and a diode Pn serving as a light-receiving element are arranged in the same element region and acoustically coupled to each other.

A DC bias voltage $V_{gs}$ is applied to a gate electrode of the transistor Tr, and a DC bias voltage $V_{ds}$ is applied to a drain region, whereby stimulated phonon emission occurs, and an acoustic standing wave is excited in the element region.

Figures 27A, 27B:
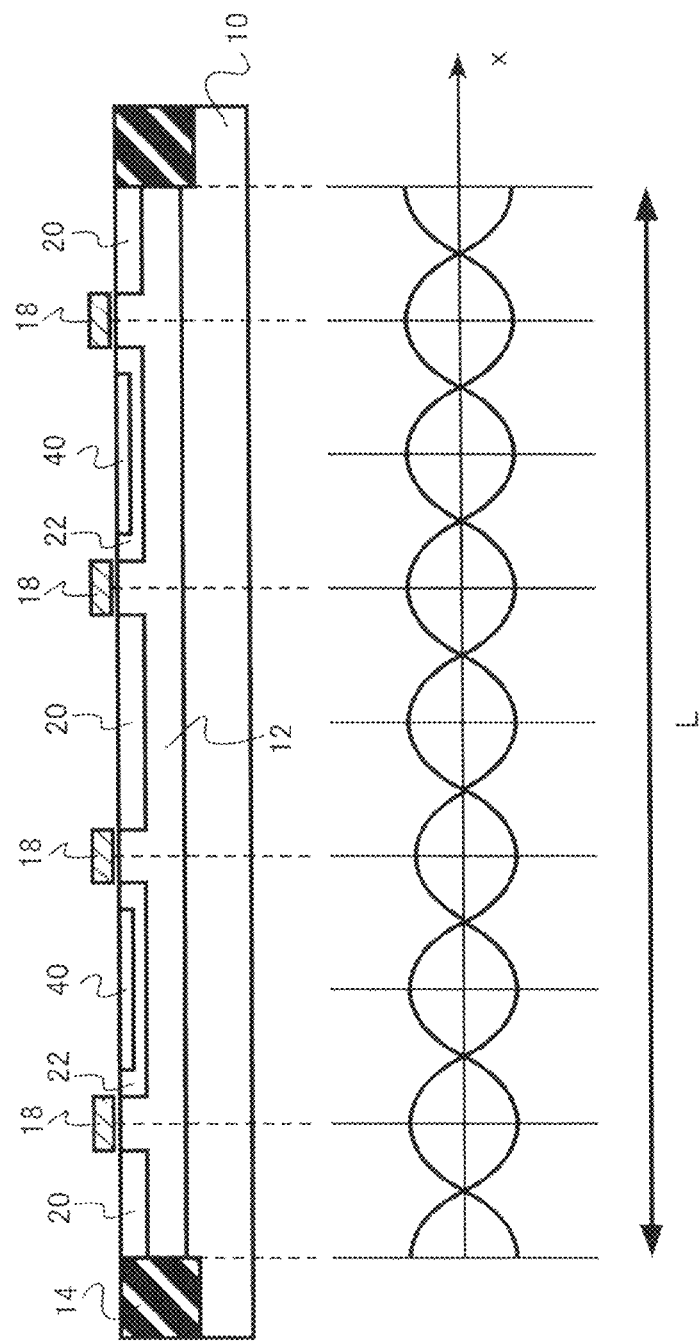
FIGS. 27A and 27B are cross-sectional views of a relevant portion of the light-receiving device of the tenth embodiment.

FIGS. 27A and 27B are cross-sectional views of a relevant portion of the light-receiving device of this embodiment. Gate electrodes 18 of the transistor Tr are arranged at regular intervals in the element region and electrically commonly connected. An acoustic standing wave having a wavelength λ the same as the pitch of the gate electrodes 18 is excited in the element region. Each gate electrode is disposed at a position where the gate electrodes have the same phase as the acoustic standing wave.

An impurity region 40 having a different electroconductive type from a drain region 22 of the transistor is disposed in the drain region 22. According to this constitution, a p-n junction type diode is formed between the drain region 22 and the impurity region 40 and used as a light-receiving element.

The light-receiving element is disposed at an intermediate position of the gate electrodes 18 adjacent to each other, whereby a wave in opposite phase to the transistor Tr is excited in a diode relative to an acoustic standing wave excited in the element region. In fact, since a phonon having a higher frequency is superimposed on the acoustic standing wave having a wavelength λ, the phonon having a high frequency functions so as to increase the probability that electrons are excited upon light reception.

In this embodiment, an n-type electrode of a p-n junction type diode is electrically commonly connected to the drain region 22 of the transistor Tr. By virtue of the application of the drain voltage $V_{ds}$, a reverse bias is applied to p-n junction of the light-receiving element.

When light energy is supplied to the p-n junction at this time, an electron in a valence band is excited in a conduction band in a depletion layer of the p-n junction, and an electron-hole pair is generated. For example, since silicon is an indirect transition type semiconductor, phonons are generated and annihilated in this case. Since the phonon is a boson, the transition probability strongly depends on the number of phonons.

Namely, when the number of phonons is $n_q$, the transition probability is proportional to $n_q+1$. In the formula, 1 corresponds to the probability of spontaneous emission. The higher the transition probability is, the higher the optical absorptance of silicon is.

In this embodiment, since a large amount of phonons generated from the stimulated phonon emission device is supplied to a p-n junction diode as a light-receiving element, the optical absorptance is significantly increased. For example, when the phonon number $n_q$ is 5000 times, the optical absorptance is 5000 times, and the optical absorptance comparable to a case where GaAs and InP as direct transition type of semiconductor crystals are used in the light-receiving element can be obtained.

According to the light-receiving device of this embodiment, a high-efficiency light-receiving device can be realized with a simple structure, using a typical semiconductor process.

Eleventh Embodiment

Light-emitting device of this embodiment is provided with a stimulated phonon emission device.

Since a basic structure of the stimulated phonon emission device is similar to that in the first to fifth embodiments, the description is omitted.

Figure 28:
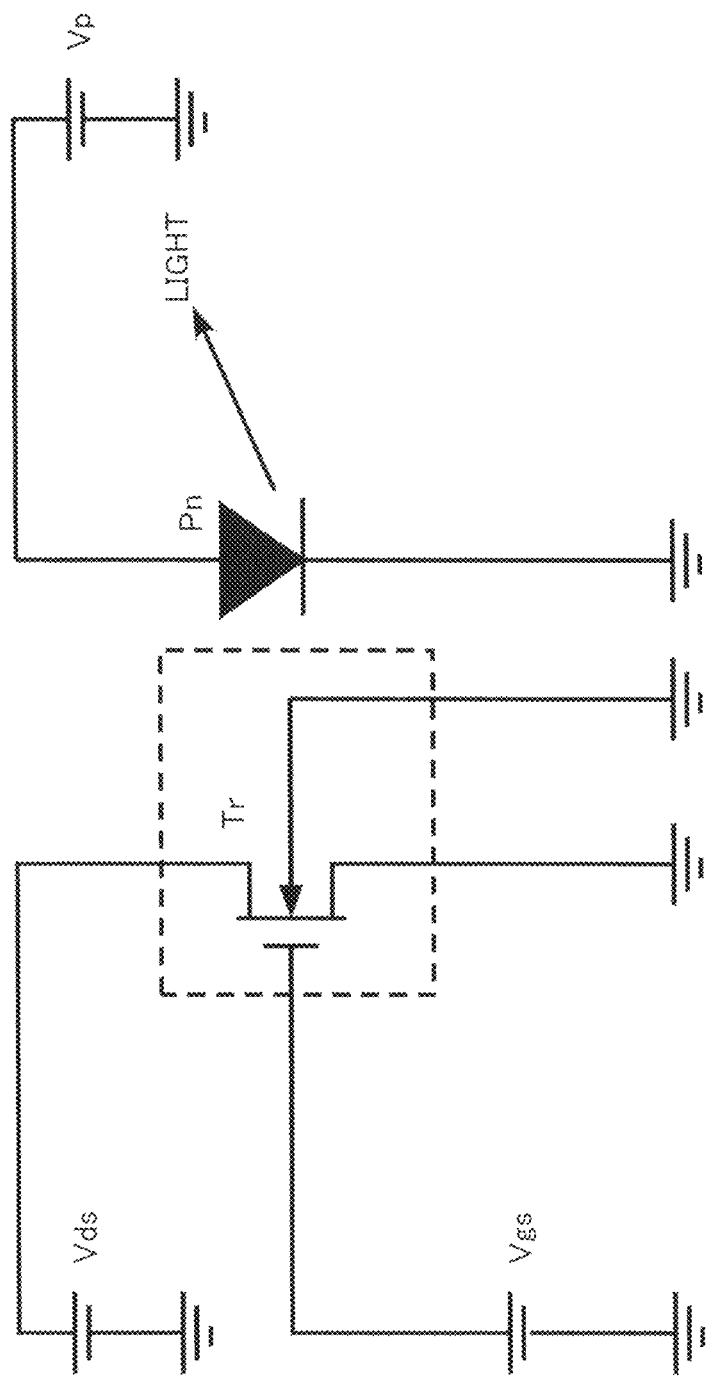
FIG. 28 is an equivalent circuit schematic of a light-emitting device of the eleventh embodiment.

FIG. 28 is an equivalent circuit schematic of the light-emitting device of this embodiment. In FIG. 28, a region surrounded by a dotted frame corresponds to the stimulated phonon emission device.

In the light-emitting device of this embodiment, a transistor Tr serving as a stimulated phonon emission device and a diode Pn serving as a light-emitting element are arranged in the same element region and acoustically coupled to each other. A DC bias voltage $V_{gs}$ is applied to a gate electrode of the transistor Tr, and a DC bias voltage $V_{ds}$ is applied to a drain region, whereby stimulated phonon emission occurs, and an acoustic standing wave is excited in the element region.

FIGS. 29A and 29B are cross-sectional views of a relevant portion of the light-emitting device of this embodiment. The light-emitting device according to this embodiment has a structure similar to the cross-sectional view of the light-receiving device shown in FIG. 27.

Gate electrodes 18 of the transistor Tr are arranged at regular intervals in the element region and electrically commonly connected. An acoustic standing wave having a wavelength λ the same as the pitch of the gate electrodes 18 is excited in the element region. Each gate electrode is disposed at a position where the gate electrodes have the same phase as the acoustic standing wave.

An impurity region 40 having a different electroconductive type from a source region 20 of the transistor is disposed in the source region 20. According to this constitution, a p-n junction type diode is formed between the source region 20 and the impurity region 40 and used as a light-emitting element. The light-emitting element is disposed at an intermediate position of the gate electrodes adjacent to each other, whereby an amplitude wave having a phase opposite to and the same amplitude as the transistor Tr is excited in a diode relative to an acoustic standing wave excited in the element region. In fact, since a phonon having a higher frequency is superimposed on the acoustic standing wave having a wavelength λ, the phonon having a high frequency functions so as to increase the probability that an electron and a positive hole are recombined upon light emission.

In this embodiment, a DC bias voltage $V_p$ is applied to a p-type electrode of a p-n junction type diode. By virtue of the application of the DC bias voltage $V_p$, a forward bias is applied to the p-n junction of the light-emitting element.

In the recombination between the electron and the positive hole which occurs in the p-n junction, photons having a frequency corresponding to energy lost by the electron is generated. Since silicon is an indirect transition type semiconductor, phonons are generated and annihilated in the recombination. Since the phonon is a boson, the transition probability strongly depends on the number of phonons.

Namely, when the number of phonons is $n_q$, the transition probability is proportional to $n_q+1$. In the formula, 1 corresponds to the probability of spontaneous emission. The higher the transition probability is, the higher the optical absorptance of silicon is. In this embodiment, since a large amount of phonons generated from the stimulated phonon emission device is supplied to a p-n junction diode as a light-emitting element, the optical absorptance is significantly increased.

For example, when the phonon number $n_q$ is 5000 times, the optical absorptance is 5000 times, and the optical absorptance comparable to a case where GaAs and InP as direct transition semiconductor crystals are used in the light-receiving element can be obtained.

According to the light-emitting device of this embodiment, a high efficiency light-emitting device can be realized with a simple structure, using a typical semiconductor process.

Hereinafter, the embodiments have been described with reference to the specific examples. The above embodiments are merely examples and do not limit the embodiments. In the description of the embodiments, although the parts in the stimulated phonon emission device and so on, which are directly unnecessary for the description, have been omitted, necessary components associated with the stimulated phonon emission device and so on can be suitably selected and used.

The embodiments are applicable to any of field-effect transistors including an n-type MOS transistor (n-type MIS transistor) in which an electron is a carrier and a p-type MOS transistor (p-type MIS transistor) in which a positive hole is a carrier.

While certain embodiments have been described, these embodiments have been presented by way of example only, and are not intended to limit the scope of the inventions. Indeed, a stimulated phonon emission device and an oscillator, a frequency filter, a cooling device, a light-receiving device, and a light-emitting device provided with the stimulated phonon emission device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A stimulated phonon emission device comprising:
a semiconductor substrate of first electroconductive type, the semiconductor substrate being an indirect transition type semiconductor crystal;
a well region of second electroconductive type provided in the semiconductor substrate;
an acoustic element isolation region deeper than the well region;
an acoustic element region surrounded by the element isolation region; and
a field-effect transistor having a plurality of electrically common gate electrodes,
source region and drain region, the gate electrodes being provided on the well region in the acoustic element region, the gate electrodes being parallel to each other, the gate electrodes being arranged at a constant pitch, the source region and the drain region having first electroconductive type, the source region and drain region being provided in the well region in the acoustic element regions region on the both sides of the gate electrode; wherein the acoustic element isolation region comprises a cavity.

2. The device according to claim 1, wherein the depth of the acoustic element isolation region is not less than 0.3 times the pitch.

3. The device according to claim 1, further comprising: a gate terminal electrically connected to the gate electrode, a source terminal electrically connected to the source region, and a drain terminal electrically connected to the drain region wherein
when a threshold voltage of the field-effect transistor is Vth, a gate voltage Vgs applied to between the source terminal and the gate terminal and a drain voltage Vds applied to between the source terminal and the drain terminal satisfy
a relation of Vth<Vgs<Vds+Vth.

4. The device according to claim 1, wherein the indirect transition type semiconductor crystal is silicon or germanium.

5. An oscillator comprising the device according to claim 1, wherein an oscillation frequency of the oscillator is substantially equal to a frequency acoustic standing wave generated in the device.

6. A frequency filter comprising the device according to claim 1, wherein a filtering frequency of the frequency filter is substantially equal to a frequency of acoustic standing wave generated in the device.

7. A cooling device comprising the device according to claim 1, wherein phonon of heat is removed by acoustic standing wave generated in the device.

8. A light-receiving device comprising the device according to claim 1, wherein probability of receiving photon in light is enhanced by coherent phonon generated by acoustic standing wave generated in the device.

9. A light-emitting device comprising the device according to claim 1, wherein probability of recombination of electron and hole is enhanced by coherent phonon generated by acoustic standing wave generated in the device.

10. A stimulated phonon emission device comprising:
a semiconductor substrate of indirect transition type semiconductor crystal;
an acoustic element region provided in the semiconductor substrate;
a field-effect transistor having a plurality of electrically common gate electrodes, source region and drain region, the gate electrodes being provided in the element region, the gate electrodes being parallel to each other, the gate electrodes being arranged at a constant pitch, the source region and the drain region being provided in the acoustic element regions on the both sides of the gate electrode; and
a first acoustic element isolation region having a depth of not less than 0.3 times the pitch, the first acoustic element isolation region having end portions which are provided on at least the both sides of the plurality of gate electrodes and are substantially parallel to the gate electrodes; wherein the first acoustic element isolation region comprises a cavity.

11. The device according to claim 10, further comprising a second acoustic element isolation region shallower than the first element isolation region.

12. The device according to claim 10, further comprising: a gate terminal electrically connected to the gate electrode, a source terminal electrically connected to the source region, and a drain terminal electrically connected to the drain region, wherein when a threshold voltage of the field-effect transistor is Vth, a gate voltage Vgs applied to between the source terminal and the gate terminal and a drain voltage Vds applied to between the source terminal and the drain terminal satisfy a relation of Vth<Vgs<Vds+Vth.

13. A stimulated phonon emission device comprising:
a semiconductor substrate of first electroconductive type, the semiconductor substrate being an indirect transition type semiconductor crystal;
a well region of second electroconductive type provided in the semiconductor substrate;
an acoustic element isolation region deeper than the well region;
an acoustic element region surrounded by the element isolation region; and
a field-effect transistor having a single gate electrode formed on the well region in the acoustic element region, the transistor having source region and drain region of first conductive type provided in the well region in the acoustic element region on the both sides of the gate electrode; wherein the acoustic element isolation region comprises a cavity.

14. The device according to claim 13, wherein the depth of the acoustic element isolation region is not less than 0.3 times a length in the gate length direction of the element region.

15. A stimulated phonon emission device comprising:
a semiconductor substrate of an indirect transition type semiconductor crystal;
an acoustic element region provided in the semiconductor substrate;
a field-effect transistor having a single gate electrode provided in the element region, the transistor having a source region and a drain region provided in the element regions on the both sides of the gate electrode; and
a first acoustic element isolation region having a depth of not less than 0.3 times the pitch, the first acoustic element isolation region having end portions which are provided on at least the both sides of the gate electrode and substantially parallel to the gate electrode; wherein the first acoustic element isolation region comprises a cavity.

16. The device according to claim 15, further comprising a second acoustic element isolation region shallower than the first acoustic element isolation region.

* * * * *